US012197837B2

(12) United States Patent
Inazu et al.

(10) Patent No.: US 12,197,837 B2
(45) Date of Patent: Jan. 14, 2025

(54) INFORMATION PROCESSING SYSTEM, INFORMATION PROCESSING APPARATUS, USE METHOD OF INFORMATION PROCESSING APPARATUS, USER TERMINAL, AND PROGRAM THEREFOR

(71) Applicant: PALTEK CORPORATION, Tokyo (JP)

(72) Inventors: Takatoshi Inazu, Kanagawa (JP); Kai Harano, Kanagawa (JP); Yasuaki Saita, Kanagawa (JP)

(73) Assignee: PALTEK CORPORATION, Kanagawa (JP)

( * ) Notice: Subject to any disclaimer, the term of this patent is extended or adjusted under 35 U.S.C. 154(b) by 197 days.

(21) Appl. No.: 17/788,989

(22) PCT Filed: Dec. 3, 2020

(86) PCT No.: PCT/JP2020/045009
§ 371 (c)(1),
(2) Date: Jun. 24, 2022

(87) PCT Pub. No.: WO2021/131572
PCT Pub. Date: Jul. 1, 2021

(65) Prior Publication Data
US 2023/0035673 A1 Feb. 2, 2023

(30) Foreign Application Priority Data
Dec. 27, 2019 (JP) .................................. 2019-237651

(51) Int. Cl.
*G06F 9/455* (2018.01)
*G06F 30/33* (2020.01)
(Continued)

(52) U.S. Cl.
CPC ........ *G06F 30/367* (2020.01); *G06F 9/45508* (2013.01); *G06F 30/33* (2020.01);
(Continued)

(58) Field of Classification Search
CPC ........ G06F 9/45508; G06F 8/34; G06F 30/33; G06F 30/367; G06F 30/331; G05B 13/047
See application file for complete search history.

(56) References Cited

U.S. PATENT DOCUMENTS 10,387,548 B2   8/2019  Avore et al.
2002/0032559 A1*   3/2002  Hellestrand ............. G06F 30/33
703/22

(Continued)

FOREIGN PATENT DOCUMENTS

JP   2002189611 A   7/2002
JP   2002236594 A   8/2002
(Continued)

OTHER PUBLICATIONS

Shimizu et al., JP 2004260188, (translation), Sep. 16, 2004, 27 pgs <JP_2004260188.pdf>.*
(Continued)

*Primary Examiner* — Tuan A Vu
(74) *Attorney, Agent, or Firm* — DiPerna Law Firm, P.C.

(57) ABSTRACT

According to this invention, it is possible to reduce the load of the user in a work of operating a model described in a hardware description language, and allow the user to readily make a change. This invention provides an information processing apparatus including a hardware processor that emulates, by hardware, operations corresponding to a model described in a hardware description language, and a control unit that controls, in accordance with instructions of a user received from a user terminal, at least one of inputs to the
(Continued)

hardware processor and outputs from the hardware processor.

18 Claims, 34 Drawing Sheets

(51) Int. Cl.
*G06F 30/367* (2020.01)
*G05B 13/04* (2006.01)
*G06F 8/34* (2018.01)
*G06F 30/331* (2020.01)

(52) U.S. Cl.
CPC .............. *G05B 13/047* (2013.01); *G06F 8/34* (2013.01); *G06F 30/331* (2020.01)

(56) References Cited

U.S. PATENT DOCUMENTS

| | | | | |
|---|---|---|---|---|
| 2002/0059054 | A1* | 5/2002 | Bade | G06F 30/33 703/20 |
| 2002/0080174 | A1* | 6/2002 | Kodosky | G06F 8/34 714/E11.171 |
| 2006/0117274 | A1* | 6/2006 | Tseng | G06F 30/331 716/117 |
| 2008/0270103 | A1* | 10/2008 | Kaszynski | G06F 30/33 703/22 |
| 2009/0049417 | A1 | 2/2009 | Kinoshita et al. | |
| 2013/0197677 | A1* | 8/2013 | Gahinet | G05B 13/047 700/33 |
| 2013/0311152 | A1* | 11/2013 | Walker | G06F 30/367 703/4 |
| 2014/0107995 | A1* | 4/2014 | Kostick | G06F 30/331 703/13 |

FOREIGN PATENT DOCUMENTS

| | | |
|---|---|---|
| JP | 2009048367 A | 3/2009 |
| JP | 2019153118 A | 9/2019 |
| TW | 201913385 A | 4/2019 |
| TW | 201941159 A | 10/2019 |

OTHER PUBLICATIONS

JP 54712406, (translation), 4-16, 2014, 18pgs <JP_5471406.pdf>.*
Brown et al., JP 2004078904, (translation), Mar. 11, 2004, 69 pgs <JP_2004078904.pdf>.*
International Search Report and Written Opinion in PCT/JP2020/045009, mailed Jan. 12, 2021, 10 pages.
First Office Action in Taiwanese Application No. 109143420, mailed Nov. 25, 2021, 6 pages.

* cited by examiner

FILE(F) | SETTING(S) | APPARATUS | HELP(H)

| 711 | 712 | 713 | 714 | 715 | 716 | 717 | 718 |

CONNECTION | USER SETTING | EVENT SETTING | CAN SETTING | COMMAND GROUP SETTING | SCENARIO EXECUTION | RESET | MONITOR / GRAPH

751 →

| EVENT TYPE | EVENT NAME | ADDRESS (HEX) | INTERVAL (ms) |
|---|---|---|---|
| TIMER-0 | 1000ms | 60000100 | 1000 |
| TIMER-1 | | 60000104 | 0 |
| TIMER-2 | | 60000108 | 0 |
| TIMER-3 | | 6000010C | 0 |
| TIMER-4 | | 60000110 | 0 |
| TIMER-5 | | 60000114 | 0 |
| TIMER-6 | | 60000118 | 0 |
| TIMER-7 | | 6000011C | 0 |
| TIMER-8 | | 60000120 | 0 |

752 →

| EVENT TYPE | EVENT NAME | Filter1(HEX) | Filter2(HEX) | Filter3(HEX) | Filter4(HEX) |
|---|---|---|---|---|---|
| CAN-0 | Can.o_id_0X246 | 0246 | 0000 | 0000 | 0000 |
| CAN-1 | | 0000 | 0000 | 0000 | 0000 |
| CAN-2 | | 0000 | 0000 | 0000 | 0000 |
| CAN-3 | | 0000 | 0000 | 0000 | 0000 |
| CAN-4 | | 0000 | 0000 | 0000 | 0000 |
| CAN-5 | | 0000 | 0000 | 0000 | 0000 |
| CAN-6 | | 0000 | 0000 | 0000 | 0000 |
| CAN-7 | | 0000 | 0000 | 0000 | 0000 |
| CAN-8 | | 0000 | 0000 | 0000 | 0000 |

APPLY

EVENT SETTING SCREEN

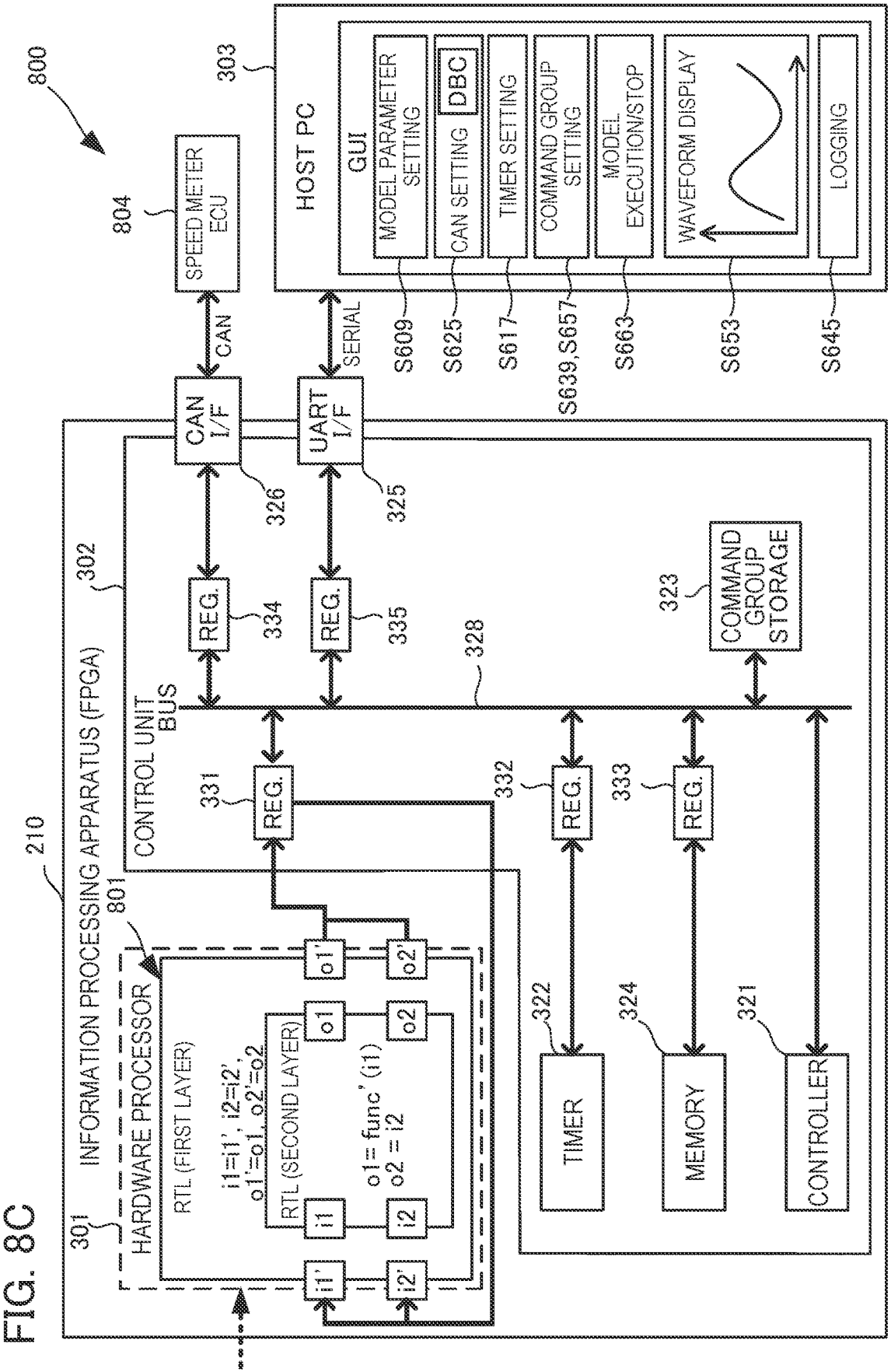

INFORMATION PROCESSING SYSTEM, INFORMATION PROCESSING APPARATUS, USE METHOD OF INFORMATION PROCESSING APPARATUS, USER TERMINAL, AND PROGRAM THEREFOR

CROSS-REFERENCE TO RELATED APPLICATIONS

This application is a National Phase application under 35 U.S.C. § 371 of PCT Application No. PCT/JP2020/045009, filed Dec. 3, 2020, which application is based upon and claims the benefit of priority from Japanese patent application No. 2019-237651, filed on Dec. 27, 2019, the disclosure of which are incorporated herein in their entirety by reference.

TECHNICAL FIELD

The present invention relates to an apparatus that executes processing by a model described in a hardware description language.

BACKGROUND ART

In the above technical field, patent literature 1 discloses a technique of implementing integrated processing by separating a model described in a hardware description language into a hardware processing portion by an FPGA (Field-Programmable Gate Array) and a software processing portion by a CPU (Central Processing Unit). Patent literature 2 discloses a technique of implementing, by an FPGA, a memory controller and an interface unit that connects a host controller and the memory controller.

CITATION LIST

Patent Literature

Patent literature 1: U.S. patent Ser. No. 10/387,548
Patent literature 2: Japanese Patent Laid-Open No. 2019-153118

SUMMARY OF THE INVENTION

Technical Problem

In the techniques described in the above patent literatures, however, it is impossible to control the input and output of hardware in accordance with a user instruction from the outside after implementing, by the hardware, a model described in a hardware description language. Therefore, a work for operating the generated hardware requires a user to take excessive time and cost, and it is not easy for the user to change the hardware after implementation.

The present invention provides a technique of solving the above-described problem.

Solution to Problem

One example aspect of the present invention provides an information processing apparatus comprising:
  a hardware processor that emulates, by a hardware, operations corresponding to a model described in a hardware description language; and
  a control unit that controls, in accordance with instructions of a user received from a user terminal, at least one of inputs to said hardware processor and outputs from said hardware processor.

Another example aspect of the present invention provides a use method of an information processing apparatus as mentioned above, the method comprising:
  setting a hardware processor in the information processing apparatus to emulate, by hardware, operations corresponding to a model described in a hardware description language;
  connecting, to the information processing apparatus, an apparatus on which one of a test target apparatus and a test target software is mounted and a user terminal that accepts instructions of a user for controlling the information processing apparatus and transmits the instructions to the information processing apparatus;
  transmitting and setting data to the information processing apparatus based on the instructions of the user accepted by the user terminal with reference to a first screen for accepting the instructions of the user for controlling the information processing apparatus; and
  displaying, on the user terminal, a second screen for displaying at least one of inputs to the information processing apparatus and outputs from the information processing apparatus based on the set data and a processing result by the hardware processor in the information processing apparatus using the set data.

Still other example aspect of the present invention provides an information processing system comprising:
  an information processing apparatus that emulates one of a software model and an apparatus model that are described in a hardware description language;
  an apparatus that is connected to said information processing apparatus and on which one of a test target apparatus and a test target software is mounted; and
  a user terminal that accepts instructions of a user for controlling said information processing apparatus and transmits the instructions to said information processing apparatus,
  said information processing apparatus comprising
  a hardware processor that emulates, by hardware, operations corresponding to one of the software model and the apparatus model, and
  a control unit that controls, in accordance with the instructions of the user received from said user terminal, at least one of inputs to said hardware processor and outputs from said hardware processor.

Still other example aspect of the present invention provides a user terminal in an information processing system as mentioned above, comprising:
  a display unit that displays a screen to a user;
  an operation unit that accepts operations of the user;
  a display control unit that generates a first screen for accepting instructions of the user for controlling an information processing apparatus and a second screen for displaying at least one of inputs to the information processing apparatus and outputs from the information processing apparatus, and displays the first screen and the second screen on said display unit; and
  a setting instructor that sets data based on the instructions of the user accepted via said operation unit into registers and a command group storage with reference to the first screen.

Still other example aspect of the present invention provides a program for causing a computer of a user terminal in an information processing system as mentioned above to execute a method, the method comprising:

generating a first screen for accepting instructions of a user for controlling an information processing apparatus and a second screen for displaying at least one of inputs to the information processing apparatus and outputs from the information processing apparatus, and displaying the first screen and the second screen on a display unit; and setting data based on the instructions of the user accepted via an operation unit into registers and a command group storage with reference to the first screen.

Advantageous Effects of Invention

According to the present invention, it is possible to reduce the load of the user in a work of operating a model described in a hardware description language, and allow the user to readily make a change.

BRIEF DESCRIPTION OF DRAWINGS

FIG. 7B is a view showing a setting screen of the user terminal for setting a user parameter in the control unit in the information processing apparatus according to the second example embodiment of the present invention;

FIG. 7E is a view showing a setting screen of the user terminal for setting an event timer in the control unit in the information processing apparatus according to the second example embodiment of the present invention;

FIG. 8C is a view showing the configuration of the information processing system in the first use example of the information processing apparatus according to the second example embodiment of the present invention;

DESCRIPTION OF EXAMPLE EMBODIMENTS

Example embodiments of the present invention will now be described in detail with reference to the drawings. It should be noted that the relative arrangement of the components, the numerical expressions and numerical values set forth in these example embodiments do not limit the scope of the present invention unless it is specifically stated otherwise.

First Example Embodiment

An information processing apparatus 100 according to the first example embodiment of the present invention will be described with reference to FIG. 1. The information processing apparatus 100 is an apparatus that executes processing by a model described in a hardware description language.

Figure 1:
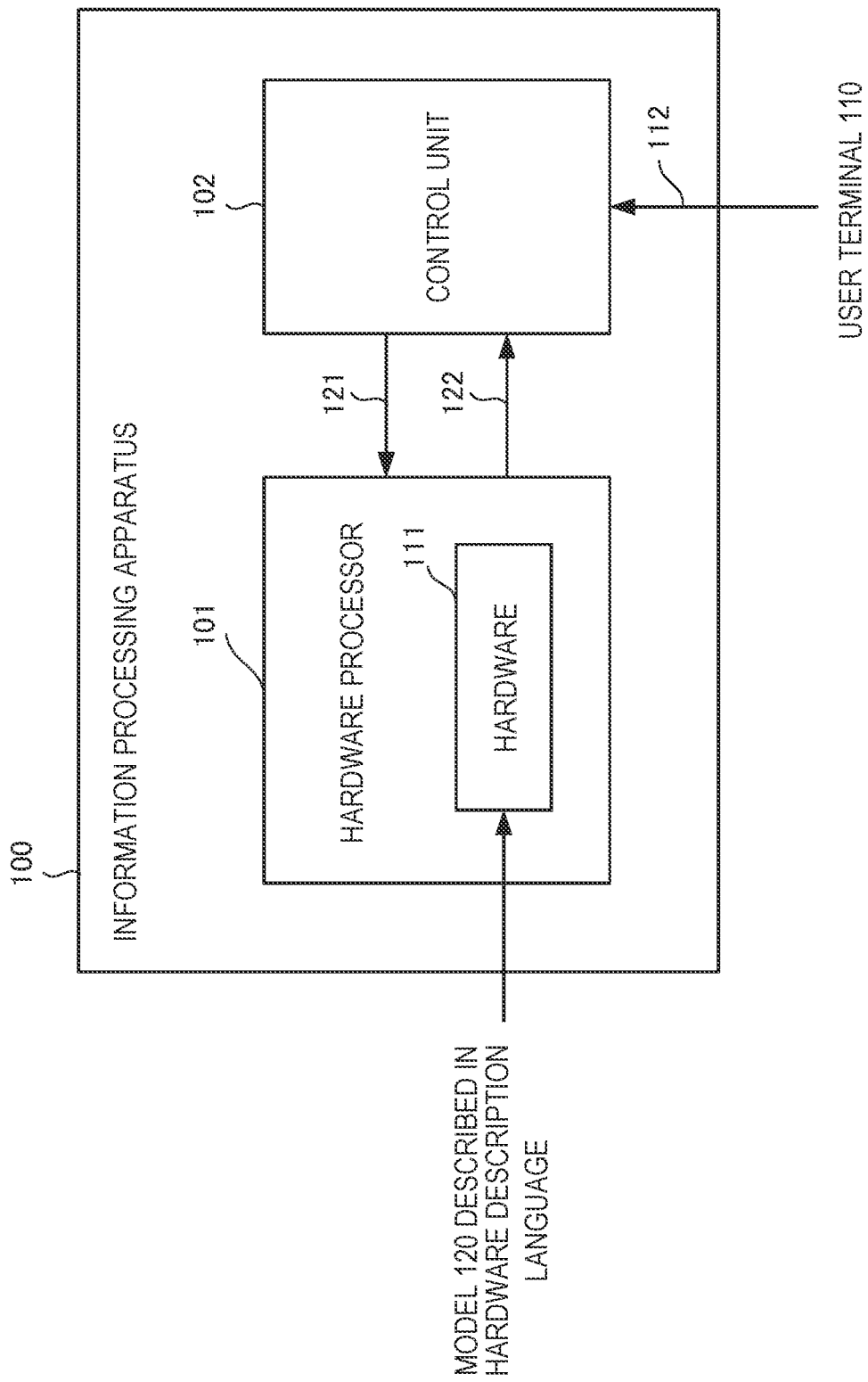
FIG. 1 is a block diagram showing the arrangement of an information processing apparatus according to the first example embodiment of the present invention.

As shown in FIG. 1, the information processing apparatus 100 includes a hardware processor 101 and a control unit 102. The hardware processor 101 simulates, by hardware 111, an operation corresponding to a model 120 described in a hardware description language. The control unit 102 controls at least one of an input 121 to the hardware processor 101 and an output 122 from the hardware processor 101 in accordance with a user instruction 112 received from a user terminal 110.

According to this example embodiment, since a work for operating the model described in the hardware description language can be implemented by a simple work by a user from a user terminal, it is possible to reduce the load of the user and allow the user to readily make a change.

Second Example Embodiment

An information processing apparatus according to the second example embodiment of the present invention will be described next. The information processing apparatus according to this example embodiment includes a hardware processor that simulates, by hardware, the operation of a model described in a hardware description language, and a control unit that controls, by the user, from a user terminal, one of an input to the hardware processor and an output from the hardware processor. The control unit includes a component that cannot be accessed by the user. Furthermore, the control unit includes registers rewritable by the user and including a register for controlling the input and the output of the hardware processor and a register for controlling the operation of the component, a command group storage that stores a command group to be executed by the component, and an interface unit that connects the information processing apparatus and an external apparatus.

The component that cannot be accessed by the user includes a controller that executes the command group and a timer for controlling a timing of executing the command group by the controller, and may further include a memory for holding data output from the hardware processor. Furthermore, the interface unit includes the first interface that connects the control unit to the user terminal as the external apparatus. The interface unit also includes the second interface that connects at least one of the input to the hardware processor and the output from the hardware processor to a test target apparatus as the external apparatus. Alternatively, the interface unit includes the third interface that performs connection to an apparatus, as the external apparatus, on which test target software is mounted. Note that the command group according to this example embodiment indicates a set of commands for the controller of the information processing apparatus to implement a predetermined scenario.

As described above, the information processing apparatus of this example embodiment can emulate a different model by rewriting hardware design data of the RTL (custom) to be written in the hardware processor. Furthermore, the user can readily adjust, from the user terminal, the input/output and the timing in emulating the model.

<<Information Processing System>>

Figure 2A:
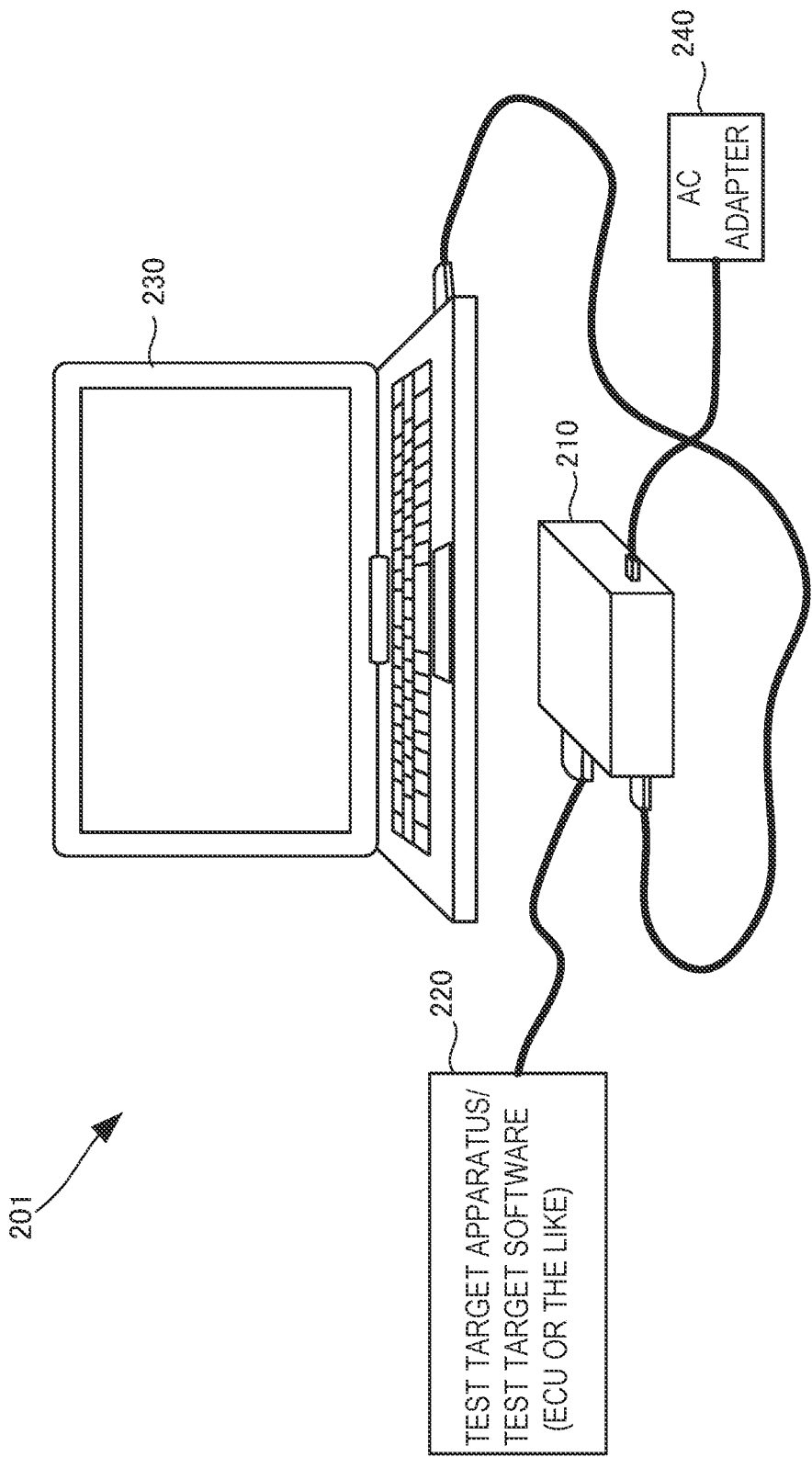
FIG. 2A is a view showing a configuration of an information processing system using an information processing apparatus according to the second example embodiment of the present invention.

FIG. 2A is a view showing the configuration of an information processing system 201 using an information processing apparatus 210.

The information processing system 201 includes the information processing apparatus 210, a test target apparatus/test target software 220 such as an ECU, and an AC adapter 240 that supplies power to the information processing apparatus 210. The information processing apparatus 210 emulates a hardware model or a software model that can test the test target apparatus/test target software 220.

Figure 2B:
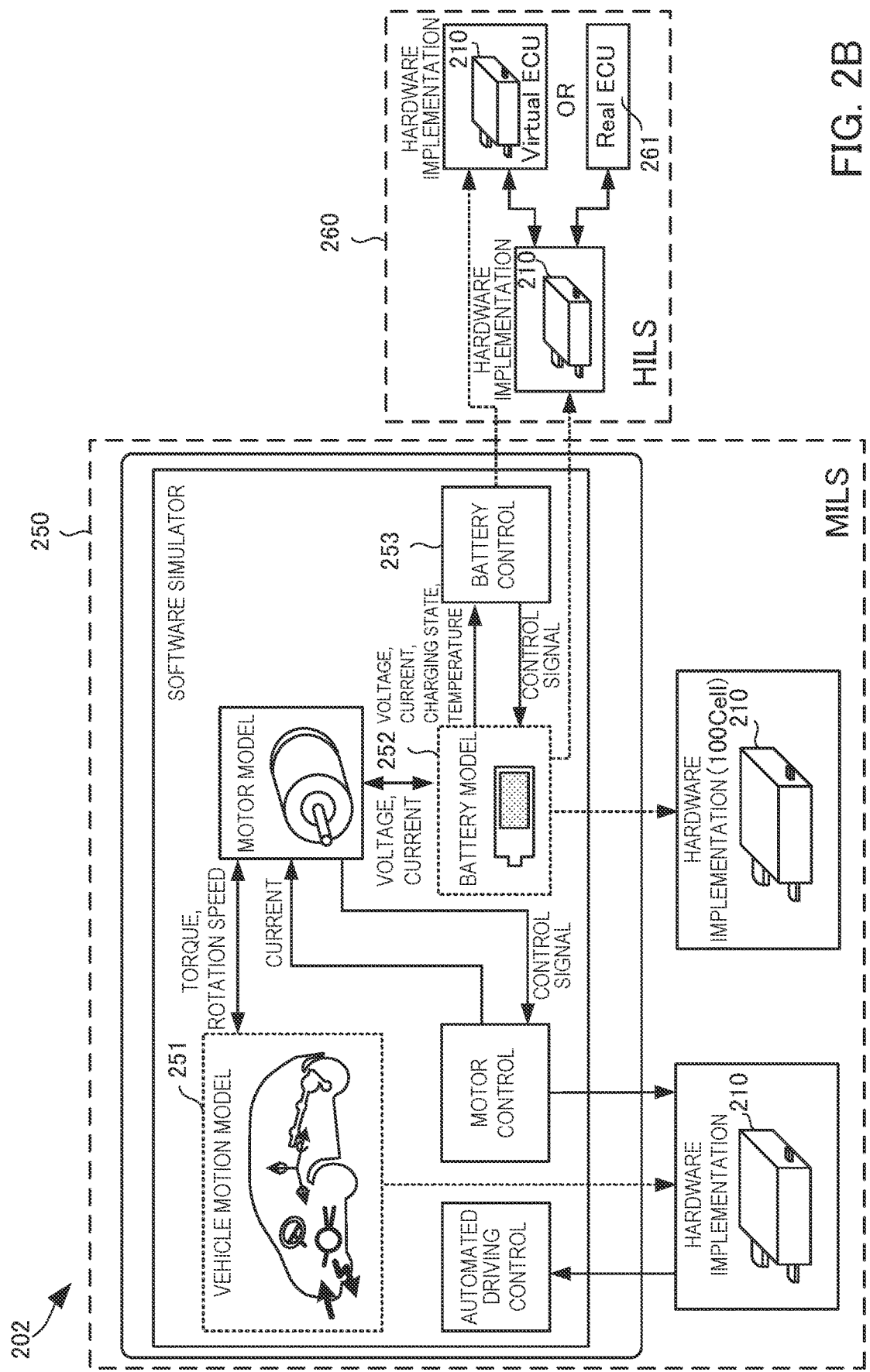
FIG. 2B is a view showing another configuration of an information processing system using the information processing apparatus according to the second example embodiment of the present invention.

FIG. 2B is a view showing another configuration of an information processing system 202 using the information processing apparatus 210.

The information processing system 202 causes the information processing apparatus 210 to emulate various models, thereby implementing MILS 250 (Model in the Loop Simulation). Furthermore, HILS 260 (Hardware in the Loop Simulation) is implemented.

As the MILS 250, for example, the information processing apparatus 210 emulates a vehicle motion model 251 and a battery model 252, thereby operating a software simulator that tests the ECU. On the other hand, as the HILS 260, the information processing apparatus 210 emulates the battery model 252 and battery control (BMS), thereby checking an ECU 261.

<<Information Processing Apparatus (FPGA: Field-Programmable Gate Array)>>

The arrangement and operation of the information processing apparatus 210 will be described in detail below with reference to FIGS. 3 to 7H.

(Functional Arrangement of Information Processing Apparatus)

Figure 3:
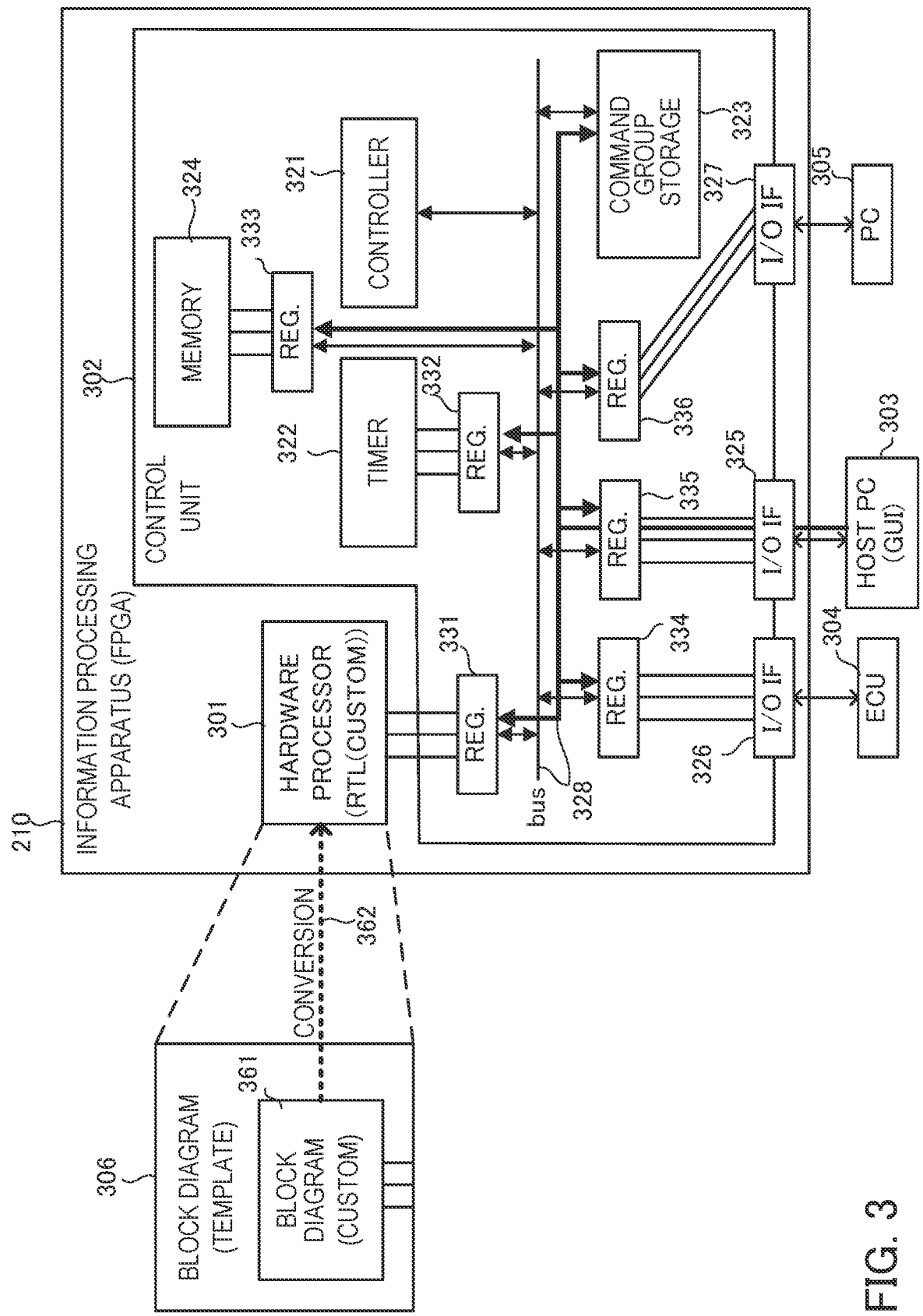
FIG. 3 is a block diagram showing the functional arrangement of the information processing apparatus according to the second example embodiment of the present invention.

FIG. 3 is a block diagram showing the functional arrangement of the information processing apparatus 210.

The information processing apparatus 210 includes a hardware processor 301 and a control unit 302. The hardware processor 301 operates as an apparatus model or a software model when, for example, hardware design data is written. The hardware design data is generated from an RTL (Register Transfer Level) hardware description language obtained by converting a block diagram (template) 306 and a block diagram (custom) 361 by an automatic conversion tool 362. This apparatus model or software model is a model using a digital signal. Note that as an example of the automatic conversion tool from a block diagram into the RTL, HDL Coder of MathWorks, Model Composer of XILINX, or the like can be used. As an example of the HDL (Hardware Description Language) for describing the RTL, VHDL (Very Highspeed Integrated Circuit Hardware Description Language), Verilog HDL, SystemVerilog, or the like is used. Although not shown, writing of the hardware design data in the hardware processor 301 is implemented in accordance with a standard defined by JTAG (Joint Test Action Group) by performing connection to a known download cable. Note that the hardware processor 301 operates in accordance with a clock independent of the control unit 302, and can perform a basic emulation operation of the model singly.

The control unit 302 controls at least one of an output from the hardware processor 301 and an input to the hardware processor 301 in accordance with a user instruction received from a user terminal (Host PC) 303.

The control unit 302 includes a controller 321, a timer 322, a command group storage 323, a memory 324, I/O interfaces (I/O IFs) 325 to 327, a bus 328, and registers 331 to 336. Note that each register is described as REG. in FIG. 3. The controller 321 executes commands stored in the command group storage 323. The controller 321 monitors the registers 331 to 336, and executes, when detecting an event as a change in each of the registers 331 to 336, a command group corresponding to the type of the event. Examples of the event include regular events each generated by a timer settable for each ms (millisecond), and events generated by the various I/Os. For example, the total number of event types is 64 since the number of timer types is 32, the number of types of I/Os is 28, and the number of preliminary types is 4. It is also possible to directly execute, from the user terminal 303, a command written in the register 335.

The timer 322 rewrites the register 332 once or periodically. The rewriting timing is set in the register 332. The command group storage 323 stores the command groups input by the user and received from the user terminal 303. When a large amount of output data is obtained from the hardware processor 301, the memory 324 buffers the output data.

The I/O IFs 325 to 327 are interfaces between the information processing apparatus 210 and the external apparatus. The I/O IF 325 is an interface with the user terminal 303, and can interface by a protocol such as UART (Universal Asynchronous Receiver/Transmitter), Ethernet®, PCI-e (Peripheral Component Interconnect-Express), USB (Universal Serial Bus), or PCI (Peripheral Component Interconnect) by setting the register 335. It is possible to write, via the I/O IF 325, data in the command group storage 323 and the registers 331 to 336 by instructions from the user terminal 303 and to read out data from the registers 331 to 336.

The I/O IF 326 can interface by a protocol such as CAN (Controller Area Network), LIN (Local Interconnect Network), Analog, GPIO (General-Purpose Input/Output), or Ethernet® by setting the register 334. Furthermore, the I/O IF 327 is an interface with test target software 305 such as a software check terminal (PC), and can interface by a protocol such as UART (Universal Asynchronous Receiver/Transmitter), Ethernet®, PCI-e (Peripheral Component Interconnect-Express), USB (Universal Serial Bus), or PCI (Peripheral Component Interconnect) by setting the register 336.

The bus 328 is directly connected to the controller 321 and the command group storage 323, and are connected to the hardware processor 301, the timer 322, the memory 324, and the I/O IFs 325 to 327 via the registers 331 to 336. Note that a thick line in FIG. 3 indicates the flow of data for setting or readout of each register on the bus 328.

The registers 331 to 336 are registers set as memory mapped I/Os of the controller 321, and are used to control the respective components connected to them. The register 331 is an interface with the RTL (custom) of the hardware processor 301. The register 331 holds input/output data of the hardware processor 301. For example, an offset value and a gain value for converting a data type are also set from the user terminal 303. Furthermore, the input value of the register 331 can be set also by a command group. In this case, calculation is executed using the input value, and an output value is set in the register 331. That is, as the input value changes, the output value changes.

The register 332 is the control register of the timer. Note that in the register 332, for example, an even generation timing (period), and activation and stop of the timer 322 are set. The user terminal 303 sets a command group execution timing (period) in the register 332. A plurality of types of timings can be set, and the start address of the command group to be executed is changed for each type of timing. The register 333 is the control register of the memory. The register 334 is the control register of the interface with a test target apparatus 304 such as an ECU, and sets, for example, the transfer speed, ID, and transfer start/stop of CAN. The register 335 is the control register of the interface with the user terminal 303, and sets, for example, a serial communication speed. The register 336 is the control register of the interface with an apparatus such as a PC on which the test target software 305 is mounted.

(Hardware Design Data)

Figure 4A:
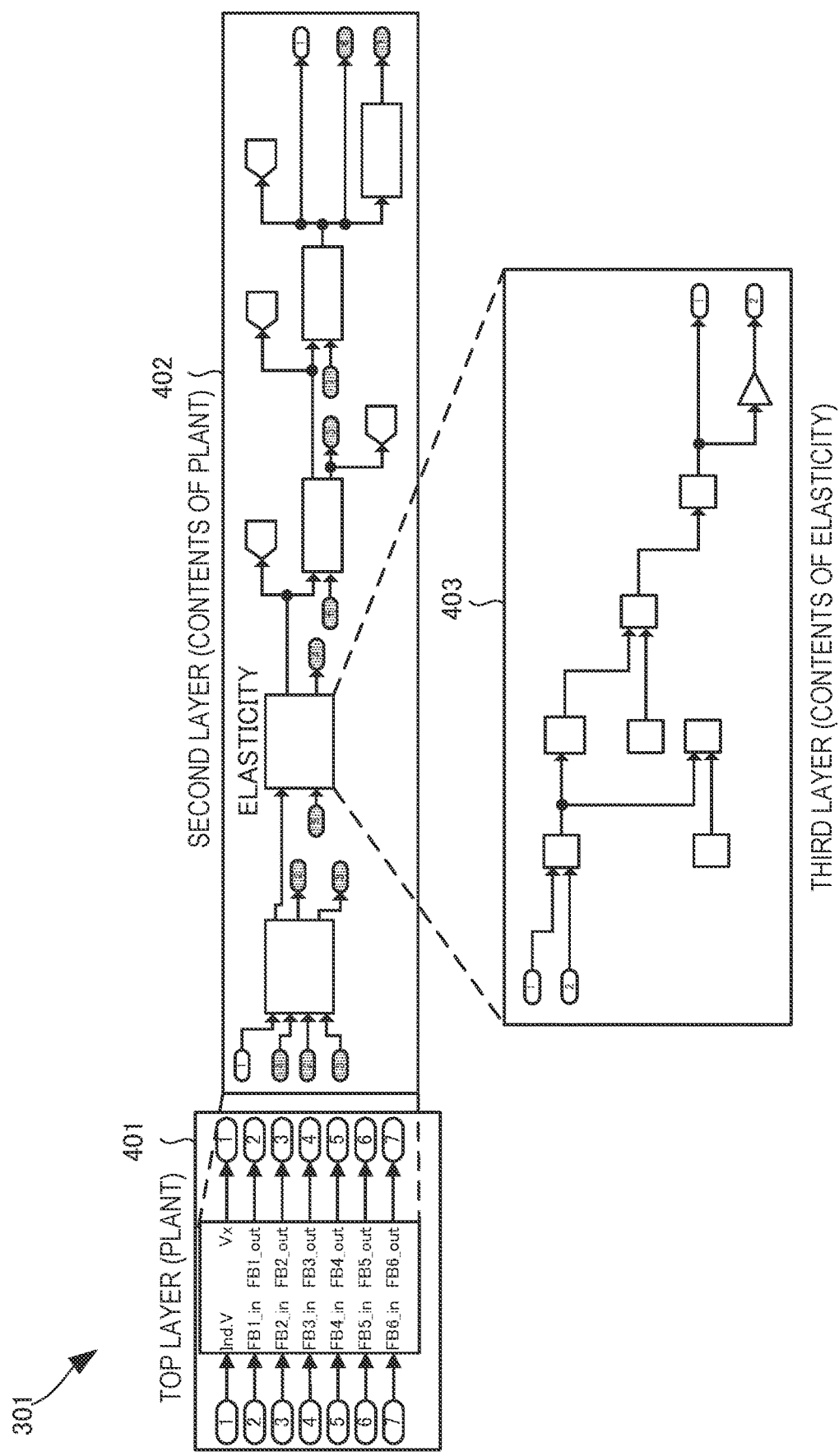
FIG. 4A is a view showing contents of hardware design data installed in a hardware processor in the information processing apparatus according to the second example embodiment of the present invention.

FIG. 4A is a view showing contents of the hardware design data installed in the hardware processor 301 in the information processing apparatus 210. Note that FIG. 4A shows an overview of the hardware design data based on a description in a hardware description language, and the present invention is not limited to this.

The hardware design data installed in the hardware processor 301 includes, for example, with respect to a top layer 401 (Plant: apparatus), a second layer 402 as a model of contents of Plant: apparatus. The hardware design data also includes a third layer 403 as a model of contents of Elasticity: elastic body as one element in the second layer. In this way, the hardware design data is described in a unit configurable by the hardware processor 301.

(Command Group Stored in Control Unit)

Figure 4B:
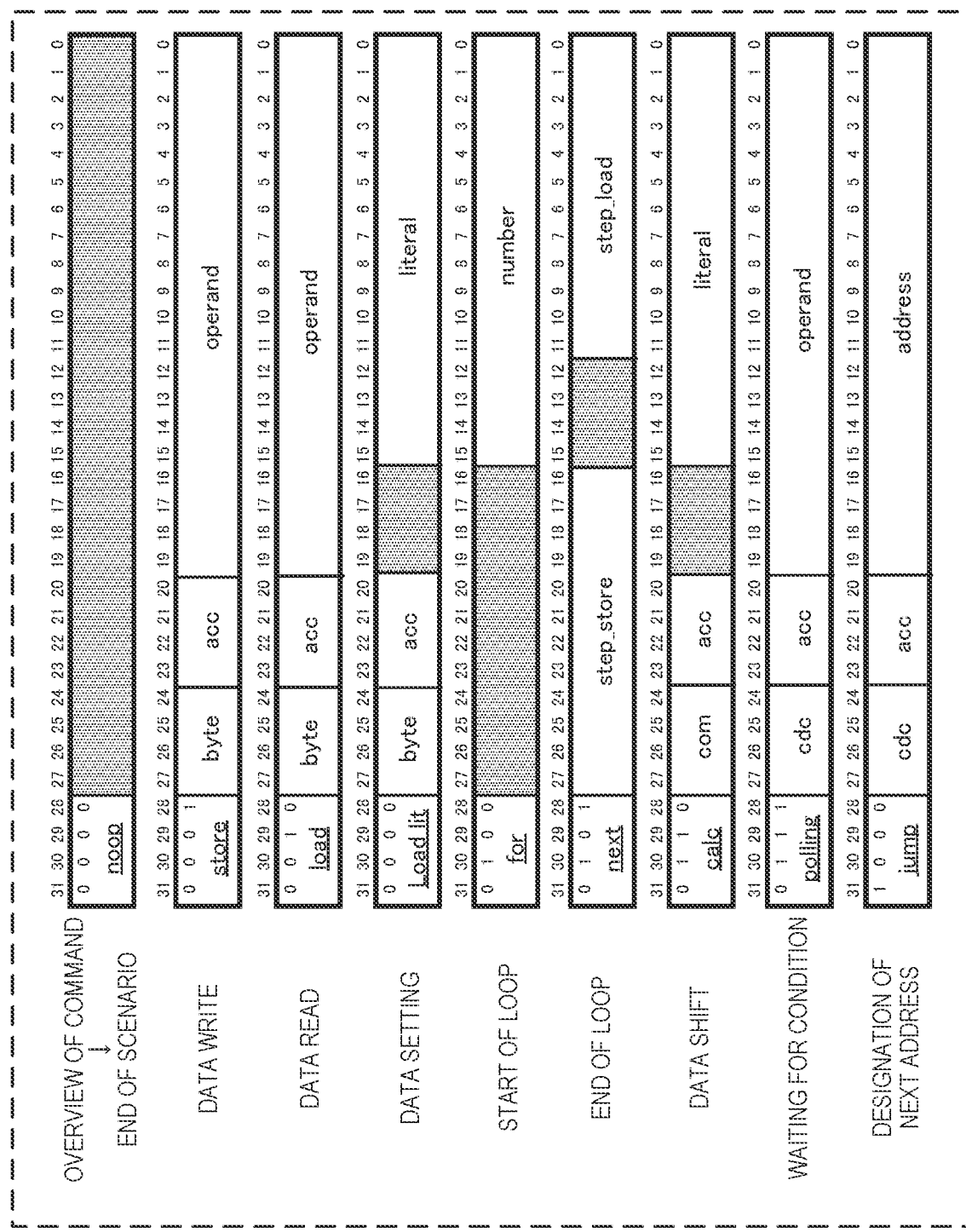
FIG. 4B is a view showing commands stored in a command group storage of the information processing apparatus according to the second example embodiment of the present invention.

FIG. 4B is a view showing commands stored in the command group storage (or register) 323 of the information processing apparatus 210.

According to this example embodiment, the nine types of commands can form a command group for reading/writing data from/in the registers 331 to 336. In accordance with the type of an event of detecting a change in each of the registers 331 to 336 including an event of the timer 322 by the register 332, the corresponding command group stored in the command group storage 323 can be executed. For example, the event of the register 331 is generated due to a change in output from the hardware processor 301. Furthermore, the event of the register 333 is generated by input/output of data to/from the memory 324. The events of the register 334 to 336 are generated by input/output of data via the I/O IFs 325 to 327.

Note that a command group generated by a combination of the commands may be generated in accordance with an operation of the control unit by the user, or may be stored in the command group register by setting a command group macro for implementing an operation on the control unit, which is provided by an application program provided from a vendor.

(Use Procedure of Information Processing Apparatus)

Figure 5:
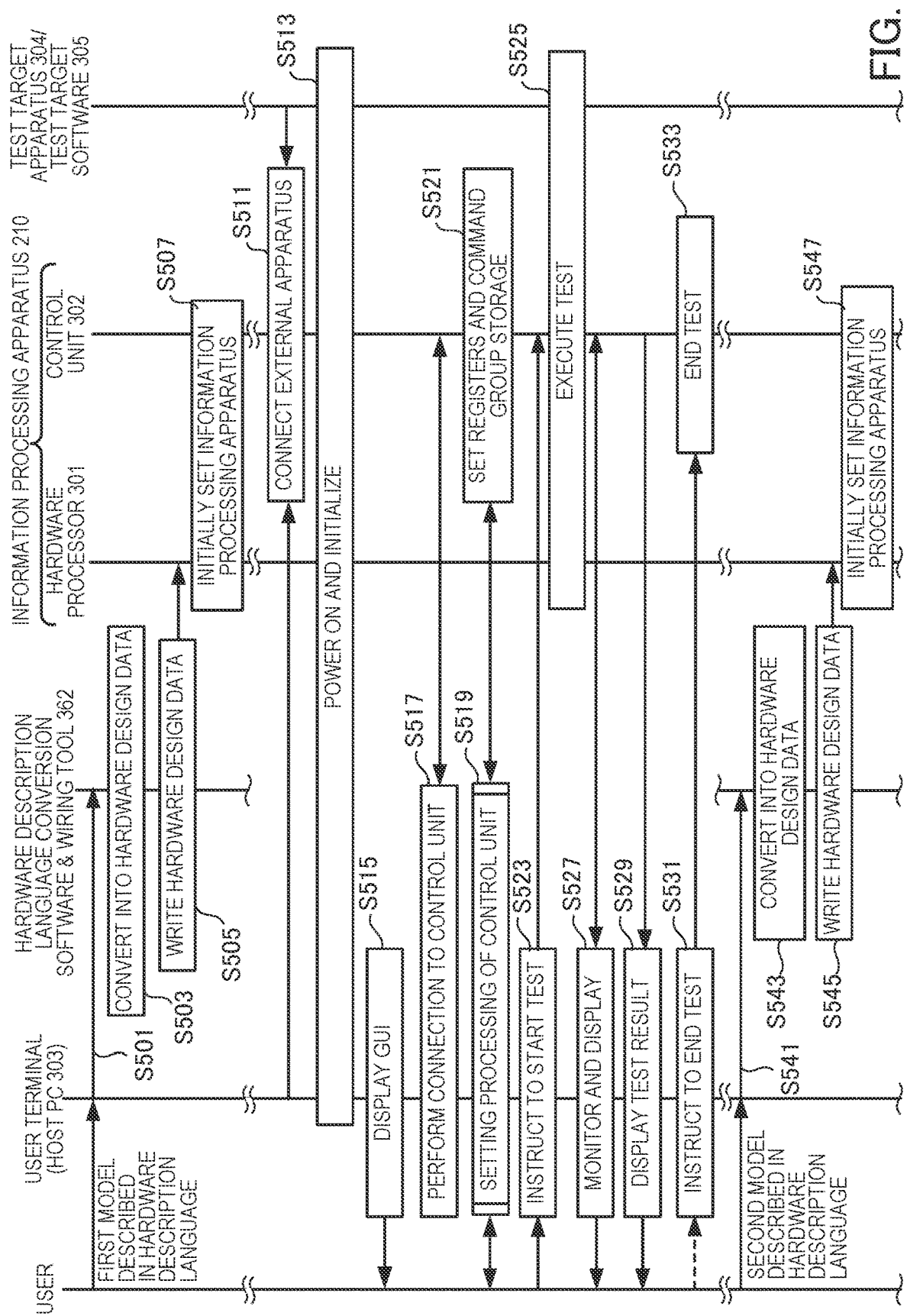
FIG. 5 is a sequence chart showing the use procedure of the information processing apparatus according to the second example embodiment of the present invention.

FIG. 5 is a sequence chart showing the use procedure of the information processing apparatus 210. Note that in FIG. 5, the procedure starts from the input of a model already converted into the hardware description language from the user terminal 303 but preceding processing of, for example, generating the hardware description language from software by the user is not illustrated.

In step S501, the first model described in the hardware description language is input by the user to the user terminal 303, and passed, from the user terminal 303, to internal or external hardware description language conversion software and the automatic conversion tool 362 as a writing tool in the hardware processor 301. In step S503, the automatic conversion tool 362 converts the first model from the hardware description language into hardware design data. Then, in step S505, the automatic conversion tool 362 writes the hardware design data in the hardware processor 301 of the information processing apparatus 210. The information processing apparatus 210 is initially set in step S507.

In step S511, the user terminal 303 and the test target apparatus 304 or the apparatus on which the test target software 305 is mounted are connected to the control unit 302 of the information processing apparatus 210. Then, the overall system is powered on to be initialized. In step S515, the user terminal 303 displays a GUI for operating the information processing apparatus 210 via the control unit 302. Then, in step S517, the user terminal 303 performs communication connection to the control unit 302. In step S519, with reference to the GUI displayed on the user terminal 303, the user performs setting processing of the control unit 302 from the user terminal 303. Especially, in step S521, the registers 331 to 336 and the command group storage 323 are set in the control unit 302.

Upon the end of the setting of the registers 331 to 336 and the command group storage 323, the user terminal 303 instructs, in step S523, to start a test in response to a user instruction. Upon receiving the test start instruction, the control unit 302 executes a test of the test target apparatus 304 or the test target software 305 together with the hardware processor 301. During the test, monitoring display (S527) of the operation of the hardware processor 301 and test result display (S529) are performed from the user terminal 303. In step S531, the user terminal 303 instructs to end the test automatically or upon receiving a user instruction. In step S533, the control unit 302 ends the test.

Subsequent steps S541 to S547 are implemented in the information processing apparatus 210 with respect to the second model different from the first model by rewriting the hardware processor 301.

(Setting Procedure of User)

Figure 6:
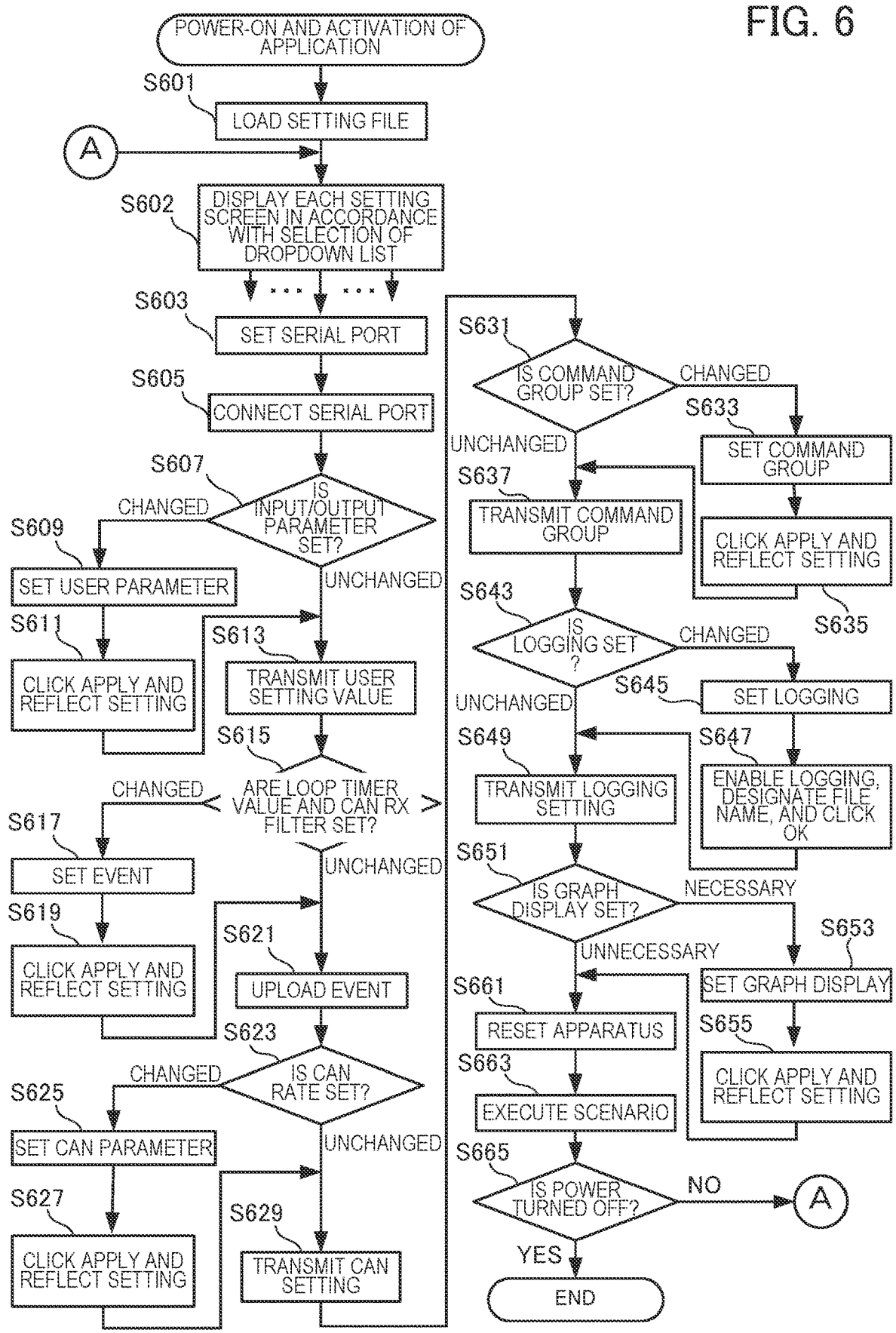
FIG. 6 is a flowchart illustrating the setting procedure of the user for the information processing apparatus according to the second example embodiment of the present invention.

FIG. 6 is a flowchart illustrating the setting procedure of the user for the information processing apparatus 210. This flowchart illustrates the processing procedure of the user terminal 303 in steps S513 to S531 of FIG. 5. Note that an example of connecting the information processing apparatus 210 to the speed meter of the ECU by CAN will be described below but the present invention is not limited to this. Assume that an application program including a GUI has already been downloaded to the user terminal 303. The flowchart shown in FIG. 6 sequentially shows the standard setting procedure by the user, and each setting processing is individually executed by selecting a dropdown list of settings. Therefore, a test of a different combination can be executed while changing the settings in each setting processing. Note that in the procedure of the setting processes, it is fixed that setting and connection (S603 and S605) of a serial port are performed first and reset of the apparatus and execution of the scenario (S661 and S663) are done after setting necessary data, and the remaining setting processes are performed in random order. Note that although not shown, the user terminal 303 includes a display unit that displays a screen to the user and an operation unit that accepts a user operation. The user terminal 303 also includes a display control unit that generates an acceptance screen for accepting a user instruction for controlling the information processing apparatus 210 and a display screen for displaying at least one of an input to the information processing apparatus 210 and an output from the information processing apparatus 210, and displays them on the display unit. The user terminal 303 further includes a setting instructor that sets data based on a user instruction accepted via the operation unit in the registers 331 to 336 and the command group storage 323 with reference to the acceptance screen.

When the information processing apparatus 210 is powered on and the application program is activated, the user terminal 303 loads, in step S601, a setting file in the folder of the application. Next, in step S602, the user terminal 303 opens a dropdown list for opening the setting file to select setting contents. Then, when display of a desired setting screen is selected, the setting procedure starts.

Figure 7A:
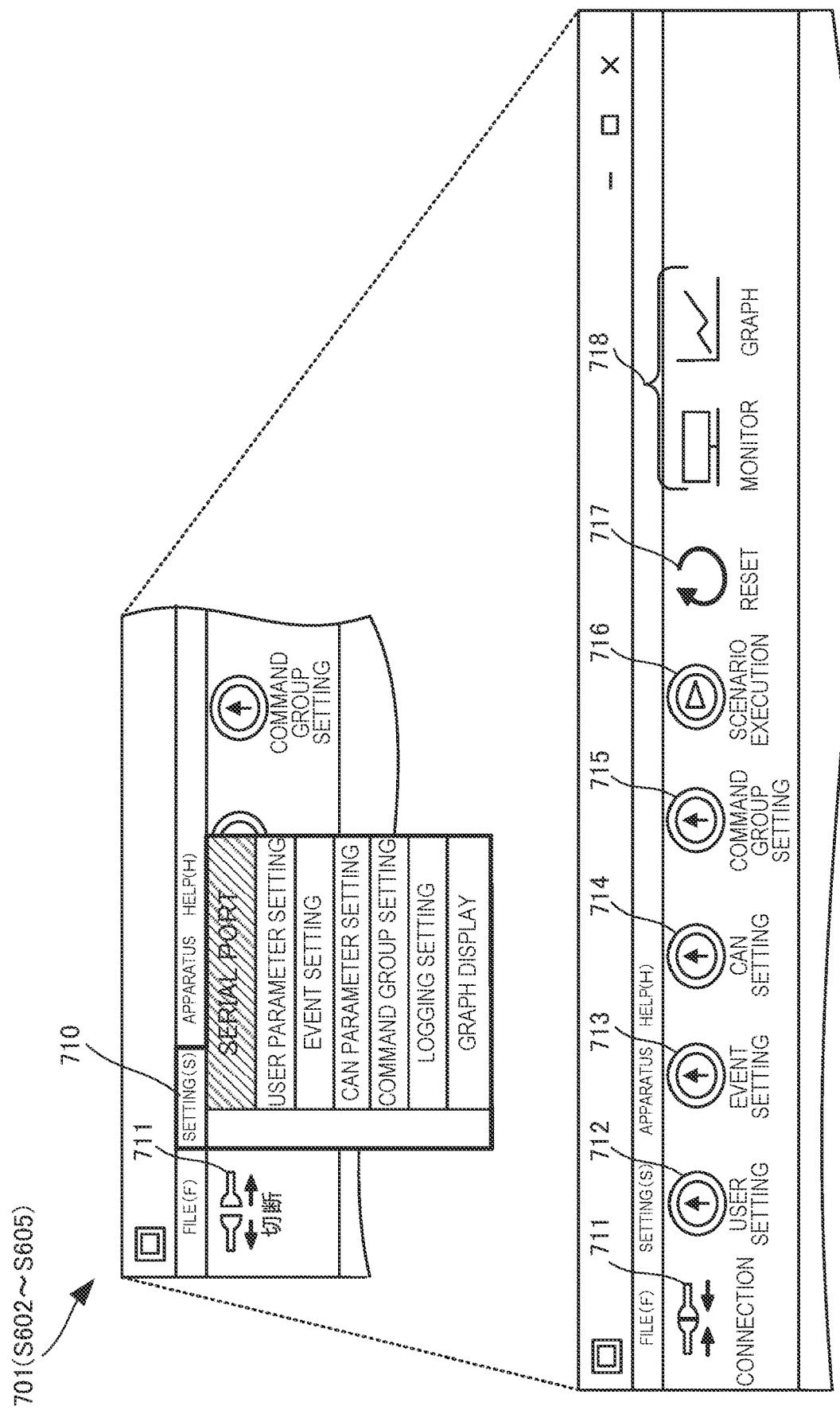
FIG. 7A is a view showing a setting screen of a user terminal associated with connection of a serial port and a dropdown list for setting a control unit in the information processing apparatus according to the second example embodiment of the present invention.

FIG. 7A is a view showing a setting screen 701 of the user terminal 303 associated with connection of a serial port and a dropdown list 710 for setting the control unit 302 in the information processing apparatus 210. The dropdown list 710 includes seven setting processes of serial port connection, user parameter setting, event setting, CAN parameter setting, command group setting, logging setting, and graph display setting. In FIG. 7A, serial port connection as the first setting processing has been selected. Furthermore, an order of a connection/disconnection button 711 a user setting button 712 an event setting button 713 a CAN setting button 714 a command group setting button 715 a scenario execution button 716 arranged from left to right indicates a standard setting procedure by the user. Therefore, by identifiably displaying the setting in progress, the user can easily know the progress state of the setting. A reset button 717 and monitoring buttons 718 including a monitor button and a graph button are displayed.

Referring back to FIG. 6, in step S603, the user terminal 303 sets a serial port. That is, a serial port for connecting the user terminal 303 is selected. Then, in step S605, the user terminal 303 connects the serial port by the connection/disconnection button 711. If the serial port is normally connected, the display of the connection/disconnection button 711 in FIG. 7A changes from disconnection display to connection display.

In step S607, the user terminal 303 determines whether to change an input/output parameter. If the input/output parameter is changed, the user terminal 303 sets, in step S609, a user parameter from the GUI. In step S611, the user terminal 303 reflects the setting of the user parameter when an apply button is clicked. Then, in step S613, the user terminal 303 transmits the user setting value to the information processing apparatus 210. At this time, for example, the register 331 is set in the processing in step S613, and is read out after execution of the scenario.

Figure 7B:
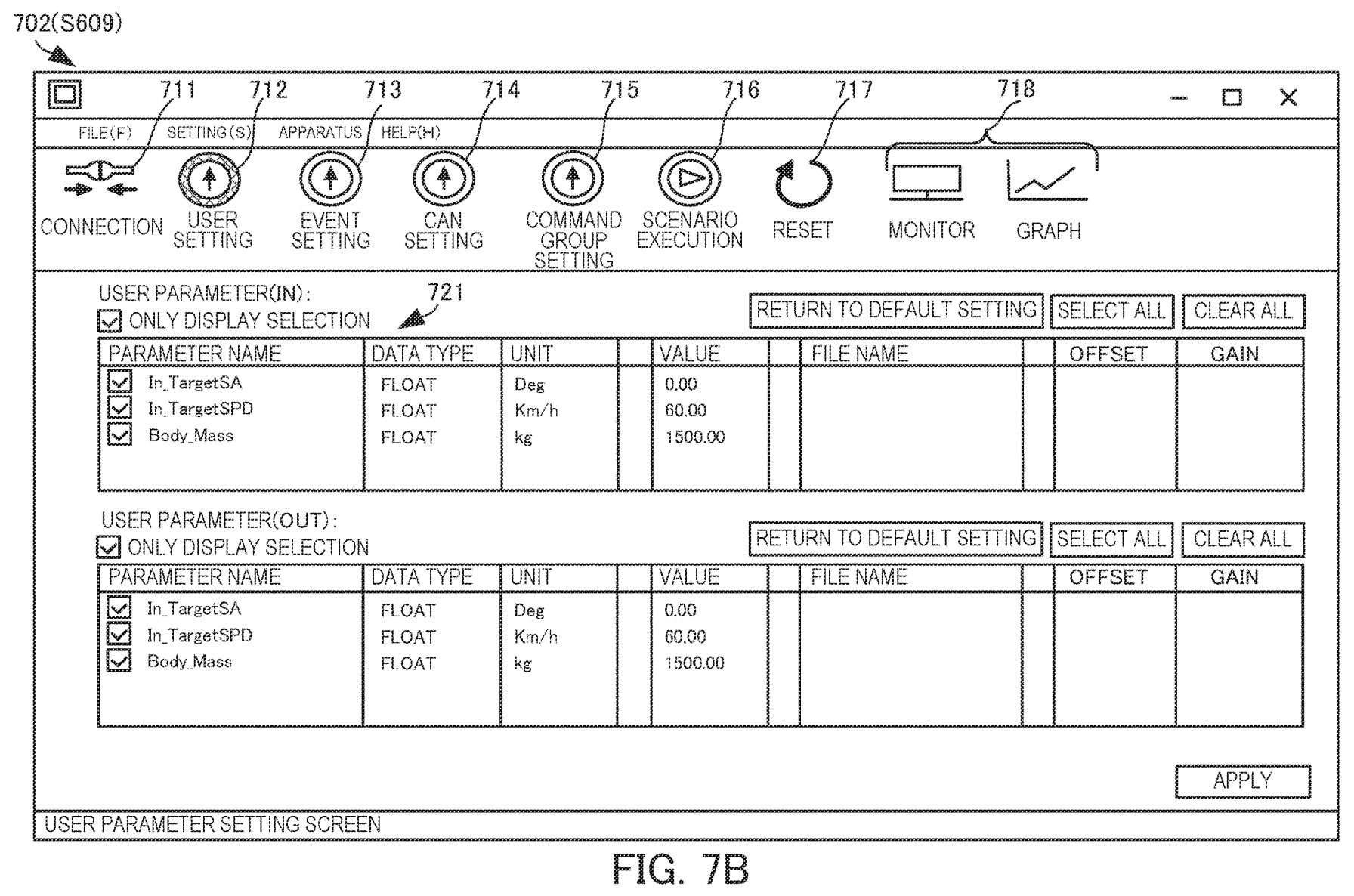

FIG. 7B is a view showing a setting screen 702 of the user terminal 303 for setting a user parameter in the control unit 302 in the information processing apparatus 210. FIG. 7B is displayed when the user parameter setting of the dropdown list 710 is selected. Referring to FIG. 7B, user parameters input to the current setting screen 702 are set by the user setting button 712. In a display region 721, it is indicated that, for example, the target speed (In TargetSPD) of a vehicle is set to 60 km/h.

Figure 7C:
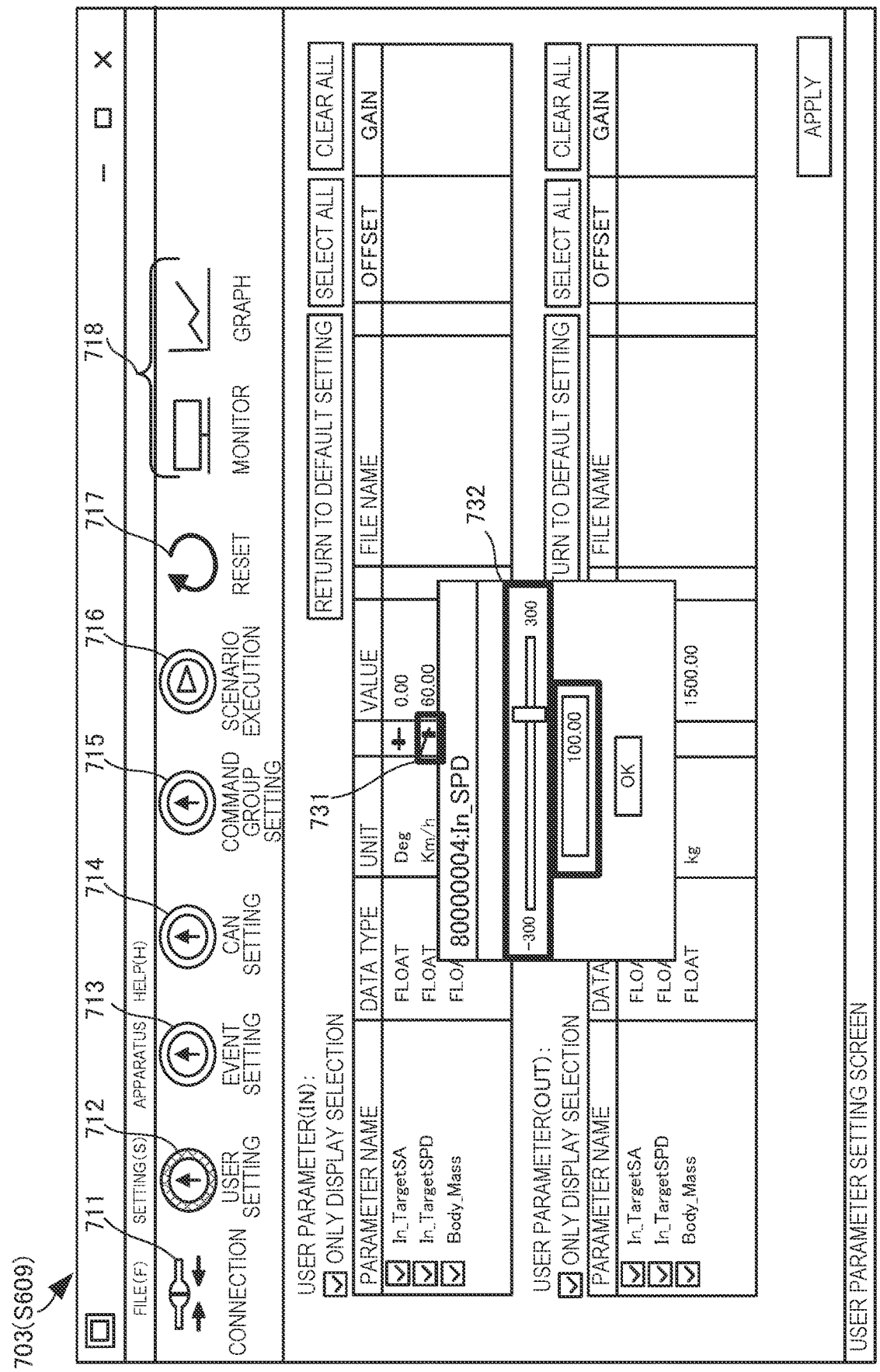
FIG. 7C is a view showing another setting screen of the user terminal for setting a user parameter in the control unit in the information processing apparatus according to the second example embodiment of the present invention.

FIG. 7C is a view showing another setting screen 703 of the user terminal 303 for setting the user parameter in the control unit 302 in the information processing apparatus 210. In FIG. 7C, it is possible to set the user parameter by a seek bar 732 by clicking a seek bar symbol 731.

Figure 7D:
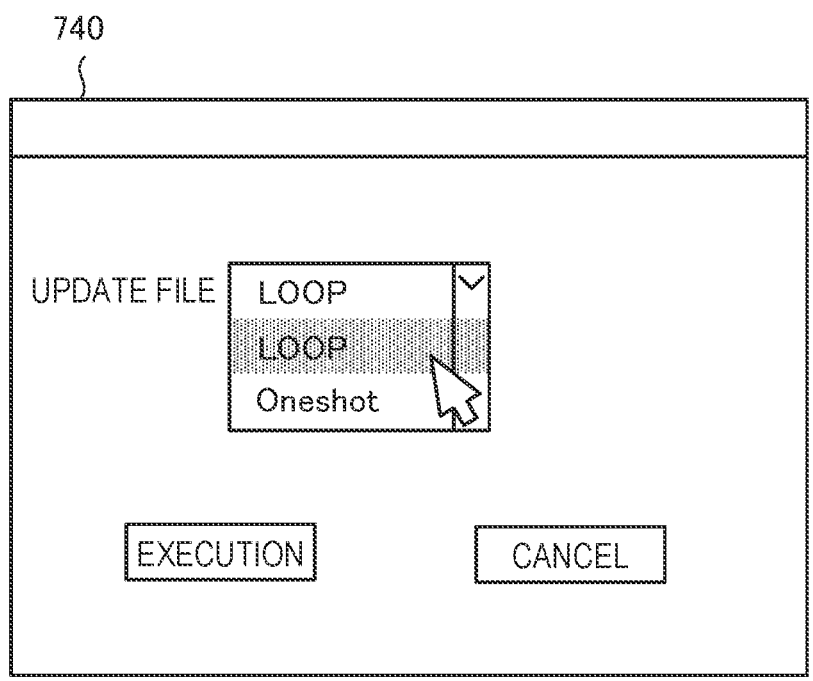
FIG. 7D is a view showing a setting screen of the user terminal for setting, when the user parameter is given as a file to the control unit in the information processing apparatus, update of contents of the file.

FIG. 7D is a view showing a setting screen 740 of the user terminal 303 for setting, when the user parameters are given as a file to the control unit 302 in the information processing apparatus 210, update of contents of the file. When the user parameters are given as a file, it is possible to set whether to update the contents of the file once (Oneshot) or repeatedly (Loop).

Referring back to FIG. 6, in step S615, the user terminal 303 determines whether to change an event generation condition including a timer value. If the event generation condition is changed, the user terminal 303 sets an event from the GUI in step S617. In step S619, the user terminal 303 reflects the setting of the event when an apply button is clicked. Then, in step S621, the user terminal 303 uploads the event to the information processing apparatus 210. The setting of the event includes setting of a timer value and a filter ID for receiving CAN data. At this time, for example, the register 332 is set in the processing in step S621.

FIG. 7E is a view showing a setting screen 705 of the user terminal 303 for setting an event in the control unit 302 in the information processing apparatus 210. FIG. 7E is displayed when the event setting of the dropdown list 710 is selected. Referring to FIG. 7E, an event input to the current setting screen 704 is set by the event setting button 713. In a display region 751, for example, it is indicated that timer 0 (TIMER-0) generates an event at an interval of 1,000 ms. In a display region 752, a filter ID for receiving CAN data is set.

Referring back to FIG. 6, in step S623, the user terminal 303 determines whether to change a CAN rate. If the CAN rate is changed, the user terminal 303 sets a CAN parameter from the GUI in step S625. In step S627, the user terminal 303 reflects the setting of the CAN parameter when an apply button is clicked. Then, in step S629, the user terminal 303 transmits the CAN setting to the information processing apparatus 210. At this time, for example, the register 334 is set in the processing in step S629, and is read out after execution of the scenario.

Figure 7F:
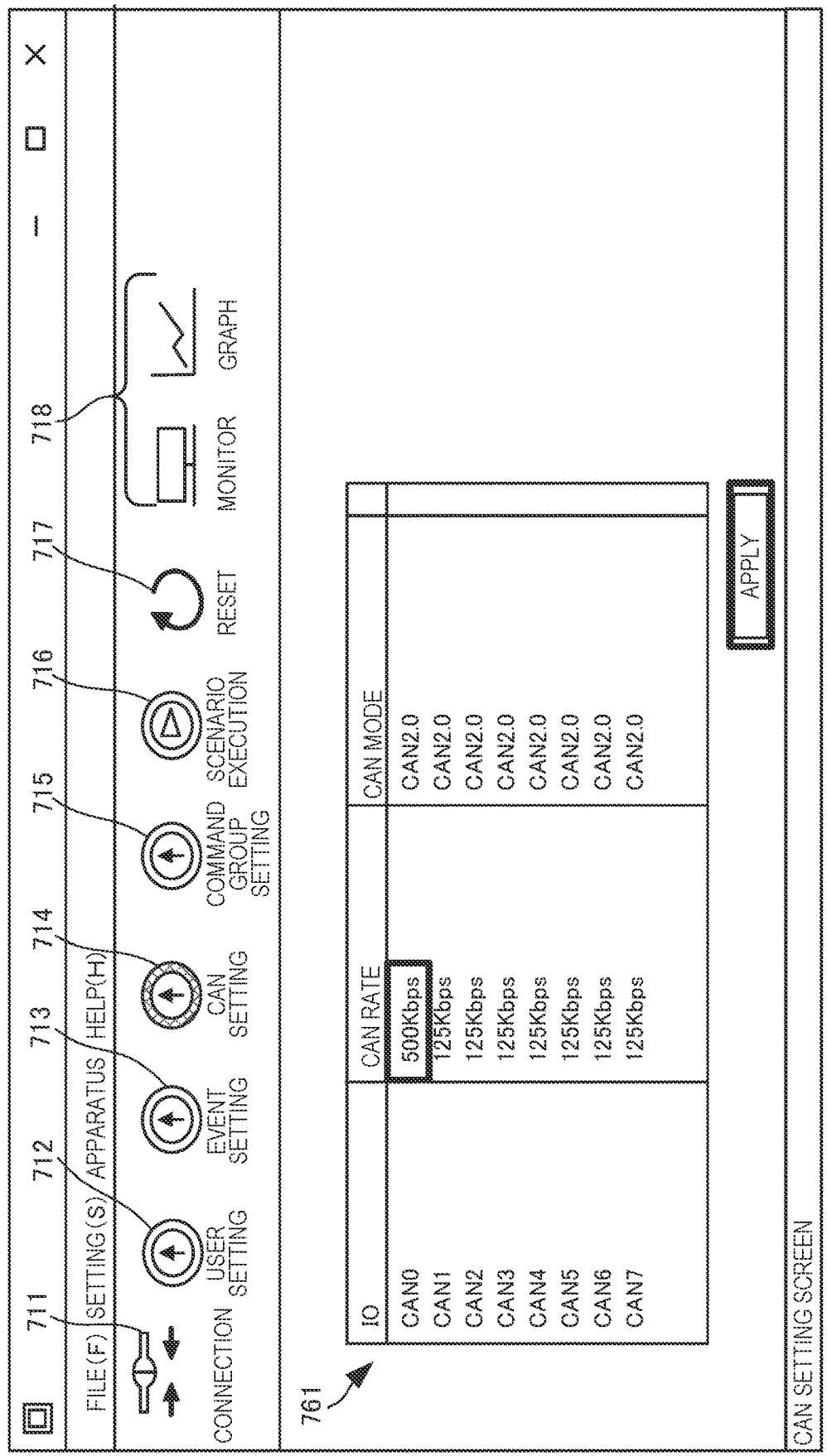
FIG. 7F is view showing a setting screen of the user terminal for setting a CAN rate in the control unit in the information processing apparatus according to the second example embodiment of the present invention.

FIG. 7F is a view showing a setting screen 706 of the user terminal 303 for setting a CAN rate in the control unit 302 in the information processing apparatus 210. FIG. 7F is displayed when the CAN parameter setting of the dropdown list 710 is selected. Referring to FIG. 7F, a CAN parameter input to the current setting screen is set by the CAN setting button 714. In a display region 761, for example, it is indicated that the rate of CAN0 is set to 500 kbps.

Referring back to FIG. 6, in step S631, the user terminal 303 determines whether to set or change a command group. If the command group is set or changed, the user terminal 303 sets, in step S633, the command group or a file including the command group from the GUI. In step S635, the user terminal 303 reflects the setting of the command group when an apply button is clicked. Then, in step S637, the user terminal 303 transmits the command group to the information processing apparatus 210. Examples of the set command group include setting of the format of CAN transmission data, setting of an output signal in each I/O IF, processing or calculation of an output signal to each I/O IF, and setting of an input signal to the RTL (custom). At this time, for example, the registers 331 and 334 are set in the processing in step S637, and are read out after execution of the scenario. For example, an input parameter is written in the register 331, and a reset signal of the I/O IF is written in the register 334.

Figure 7G:
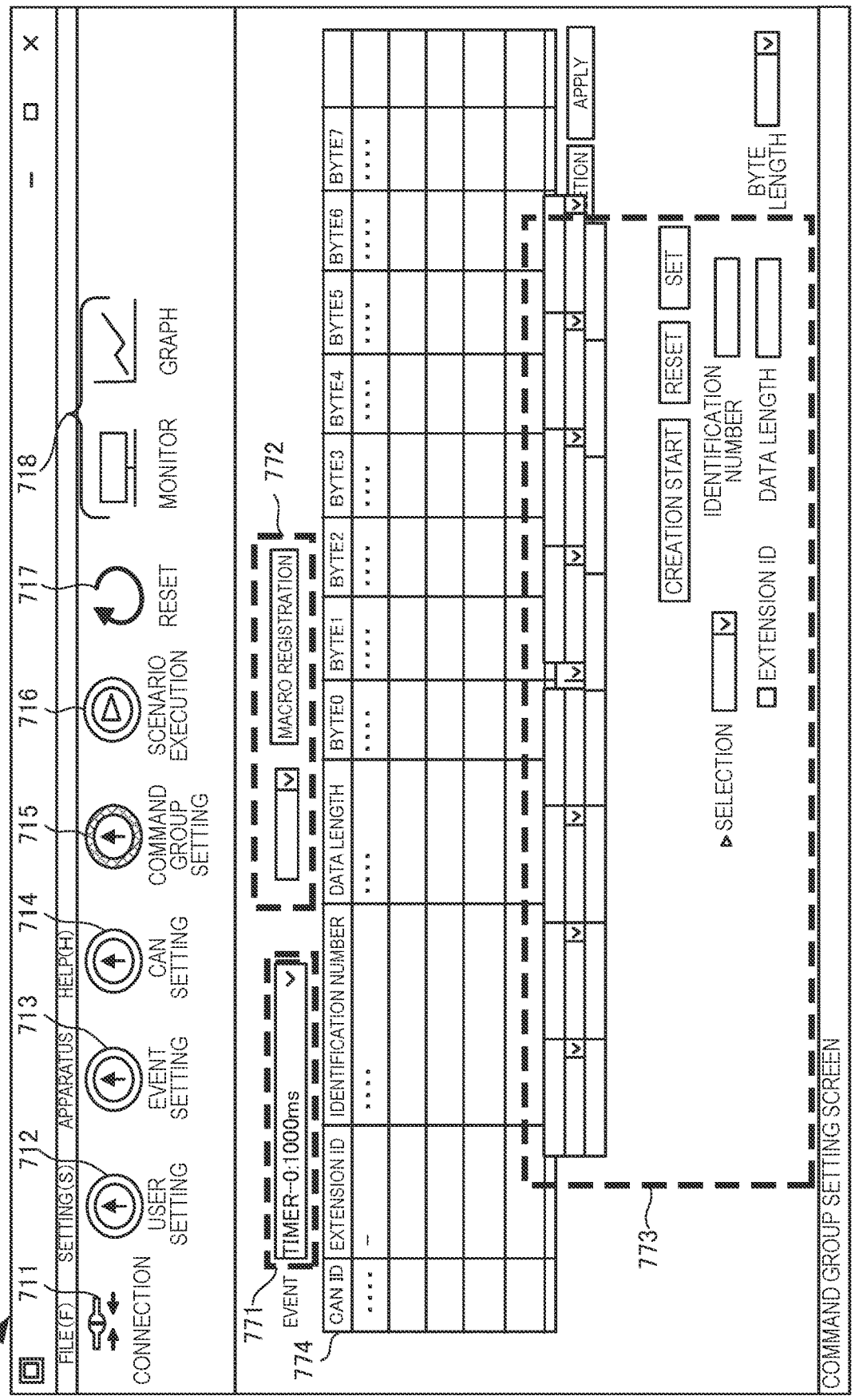
FIG. 7G is a view showing a setting screen of the user terminal for setting a command group in the control unit in the information processing apparatus according to the second example embodiment of the present invention.

FIG. 7G is a view showing a setting screen 707 of the user terminal 303 for setting the command group in the control unit 302 in the information processing apparatus 210. FIG. 7G is displayed when the command group setting of the dropdown list 710 is selected. Referring to FIG. 7G, a command group input to the current setting screen is set by the command group setting button 715. In FIG. 7G, a display region 771 indicates an event that activates the set command group. A display region 772 indicates setting of the load source of a file in which the command group is described. A display region 773 is a region for setting a CAN ID and a CAN frame format.

When an event is selected, the number of a CAN IF is selected, use/disuse of an extension ID is selected, a CAN ID is input to an identification number, a data length is input, and then a creation start button is pressed, the selected and input contents are displayed in the display region 773. In the window, when data to be transmitted by CAN is selected to confirm the CAN frame format, and then a set button is pressed, all the CAN frame formats are displayed in a display region 774. When the command group setting button 715 is pressed, the CAN frame formats are transmitted to the information processing apparatus 210.

Referring back to FIG. 6, in step S643, the user terminal 303 determines whether to change the logging setting. If the logging setting is changed, the user terminal 303 sets logging in step S645. Then, in step S647, the user terminal 303 enables logging from the GUI, designates a file name, and then clicks an OK button. In step S649, the user terminal 303 transmits the logging setting to the information processing apparatus 210. Note that the setting screen of the logging setting is not illustrated. At this time, for example, the register 333 is set in the processing in step S649, and is read out after execution of the scenario.

In step S651, the user terminal 303 determines whether graph display is necessary. If graph display is necessary, the user terminal 303 sets, in step S653, graph display from the GUI. In step S655, the user terminal 303 reflects the setting of the graph display when an apply button is clicked. At this time, for example, the register 333 is set in the processing in step S655, and is read out after execution of the scenario.

Figure 7H:
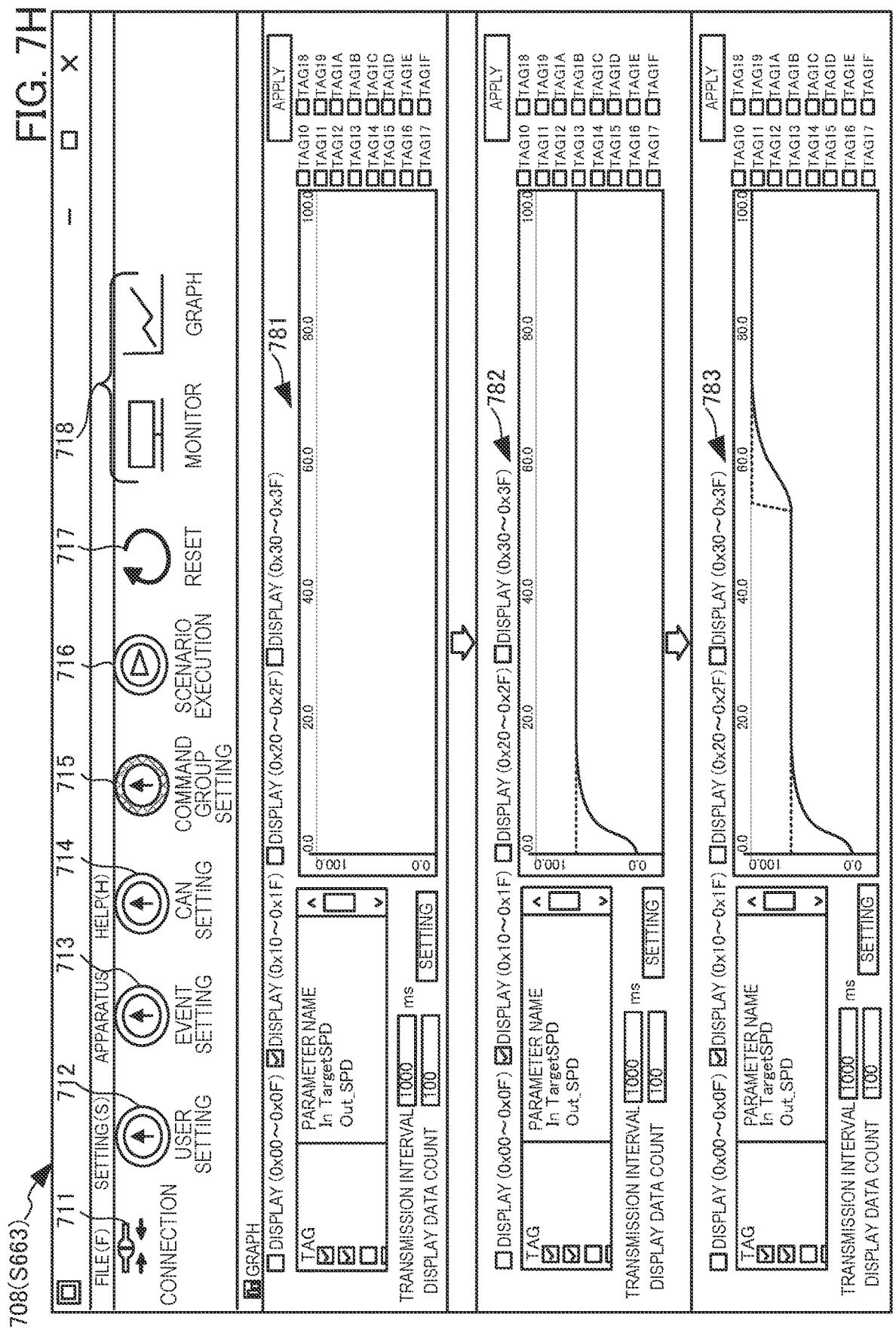
FIG. 7H is a view showing a display screen of the user terminal for displaying a change of an operation signal output from the control unit in the information processing apparatus according to the second example embodiment of the present invention.

FIG. 7H is a view showing a display screen 708 for displaying a change of an operation signal output from the control unit 302 in the information processing apparatus 210. This screen is displayed when the graph button of the monitoring buttons 718 is clicked. A display region 781 shown in FIG. 7H shows a state in which there is no data to be displayed as a graph when the graph display is set. Note that although the display screen is not shown, when the monitor button of the monitoring buttons 718 is clicked, it is possible to monitor a state during the operation of the information processing apparatus 210.

In step S661, the user terminal 303 resets the information processing apparatus 210 before execution of the scenario. In the setting screen, when the reset button 717 is clicked, the information processing apparatus 210 is reset. In step S663, the user terminal 303 executes the scenario. In the setting screen, when the scenario execution button 716 is clicked, the information processing apparatus 210 executes the scenario.

A display region 782 shown in FIG. 7H displays, as a graph, a change of the traveling speed toward a traveling speed of 60 km/h set as the target when the graph display is set and the scenario is executed. Furthermore, a display region 783 displays, as a graph, a change of the traveling speed if the traveling speed first set as the target is 60 km/h and the target is changed to 100 km/h in the middle when the graph display is set and the scenario is executed. As described above, according to this example embodiment, for example, the user can set various changes of the traveling speed of the vehicle from the user terminal while emulating the vehicle motion model.

Use Examples of Information Processing Apparatus

Use examples of the information processing apparatus 210 will be described below with reference to FIGS. 8A to 11C. Note that use examples of the information processing apparatus 210 are not limited to the following ones. The information processing apparatus 210 can be used to emulate various apparatus models or software models or to emulate an integrated model obtained by combining a plurality of models.

First Use Example

Figure 8A:
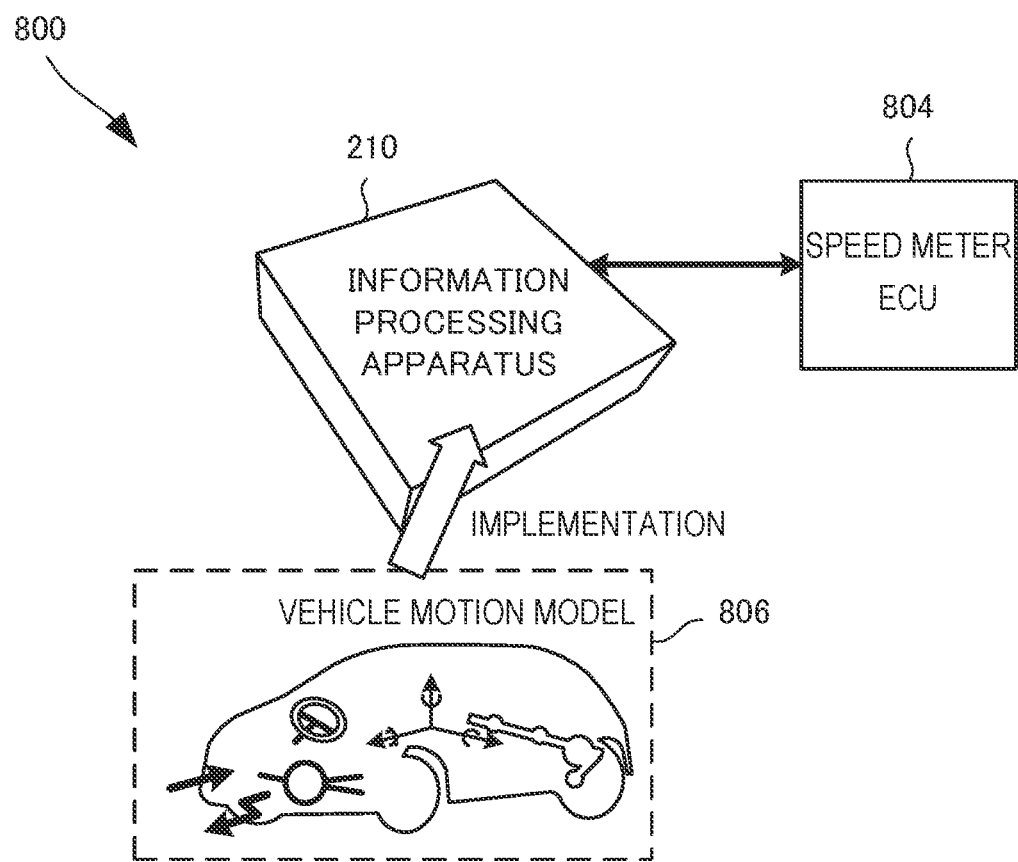
FIG. 8A is a view showing an information processing system in the first use example of the information processing apparatus according to the second example embodiment of the present invention.

FIG. 8A is a view showing an information processing system 800 in the first use example of the information processing apparatus 210.

The information processing apparatus 210 shown in FIG. 8A emulates a vehicle motion model 806 from the overall vehicle or a chassis, and outputs an actual speed. At this time, for example, the target speed of an automated driving vehicle is input to the hardware processor 301. Then, a speed meter 804 of an ECU is a test target apparatus.

Figure 8B:
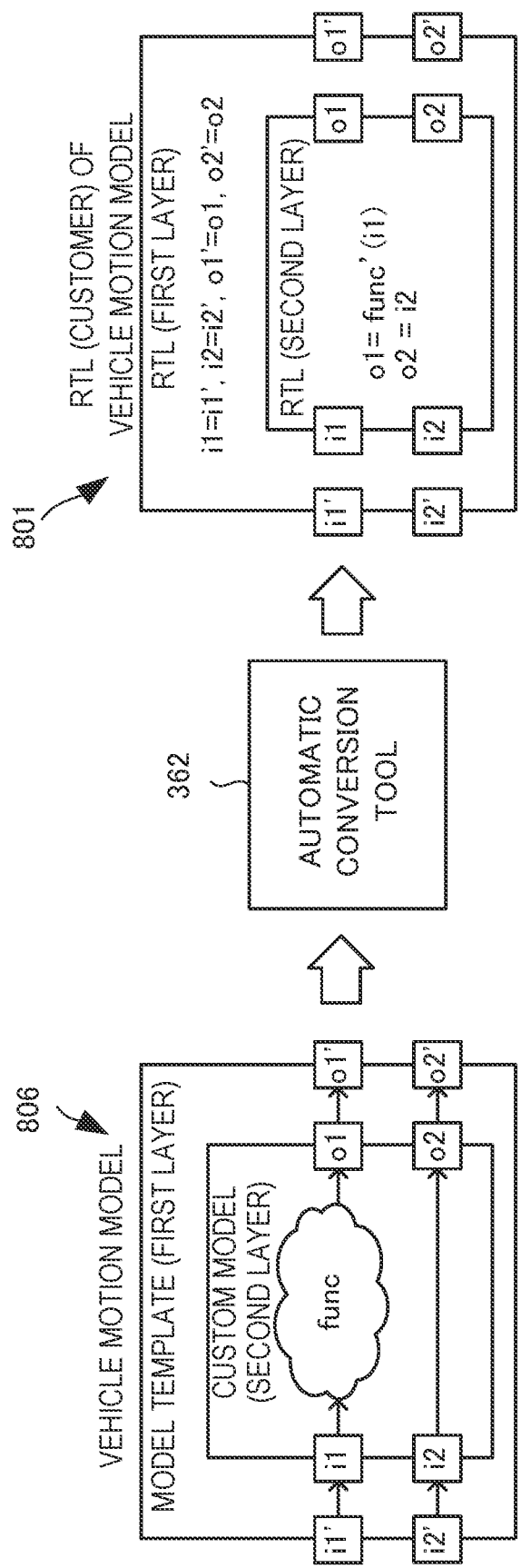
FIG. 8B is a view showing generation of hardware design data in the first use example of the information processing apparatus according to the second example embodiment of the present invention.

FIG. 8B is a view showing generation of hardware design data 801 in the first use example of the information processing apparatus 210.

The vehicle motion model 806 is converted into the RTL (custom) 801 of the vehicle motion model by the automatic conversion tool 362.

FIG. 8C is a view showing the configuration of the information processing system 800 in the first use example of the information processing apparatus 210. Note that in FIG. 8C, the same reference numerals as in FIG. 3 denote similar components and a repetitive description thereof will be omitted.

The hardware design data of the RTL (custom) 801 of the vehicle motion model is written in the hardware processor 301. Referring to FIG. 8C, the register 335 is set so that the I/O IF 325 connected to the user terminal 303 operates as a UART I/F. Furthermore, the register 334 is set so that the I/O IF 326 connected to the speed meter 804 of the ECU operates as a CAN I/F. Then, the user terminal 303 executes, in accordance with the GUI, each of modules of model parameter setting (S609), CAN setting (S625) by a DBC file, timer setting (S617), command group setting (S639 or S657), model execution/stop (S663), waveform display (graph display: S653), logging (S645) in FIG. 6.

Second Use Example

Figure 9A:
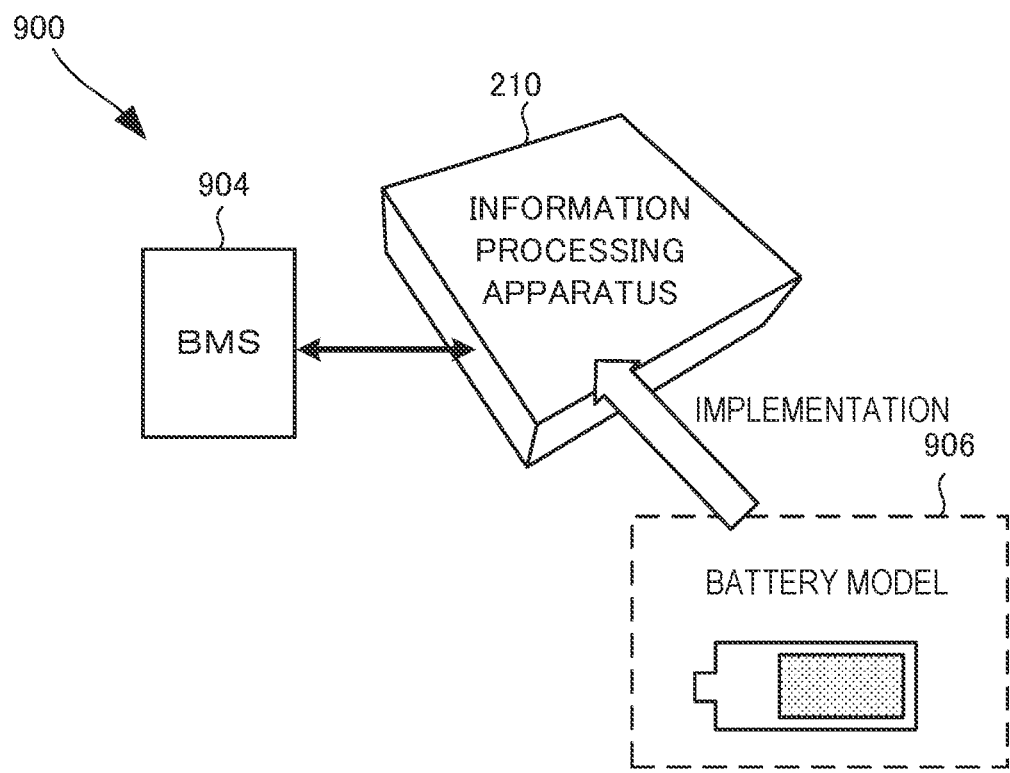
FIG. 9A is a view showing an information processing system in the second use example of the information processing apparatus according to the second example embodiment of the present invention.

FIG. 9A is a view showing an information processing system 900 in the second use example of the information processing apparatus 210. The information processing apparatus 210 shown in FIG. 9A emulates a lithium ion battery as a battery model 906, and outputs information such as a charging rate. At this time, for example, balance control (ON/OFF control for each battery cell) information is input to the hardware processor 301. Then, a BMS (Battery Management System) 904 is a test target apparatus.

Figure 9B:
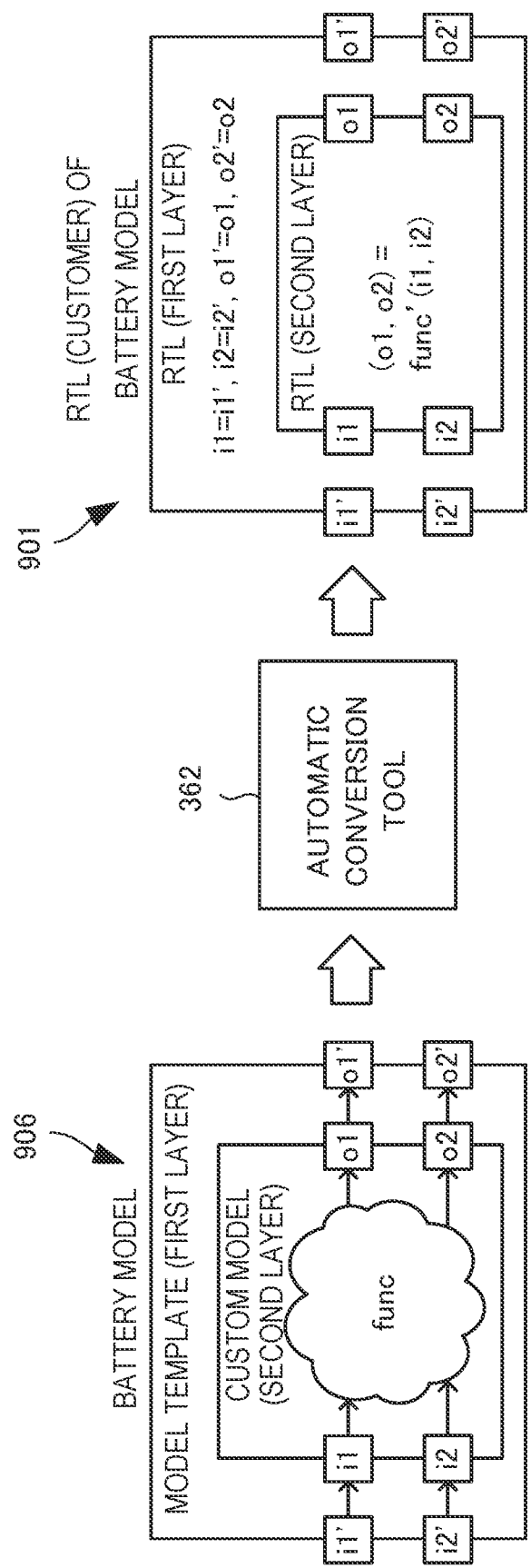
FIG. 9B is a view showing generation of hardware design data in the second use example of the information processing apparatus according to the second example embodiment of the present invention.

FIG. 9B is a view showing generation of hardware design data 901 in the second use example of the information processing apparatus 210.

The battery model 906 is converted into the RTL (custom) 901 of the battery model by the automatic conversion tool 362.

Figure 9C:
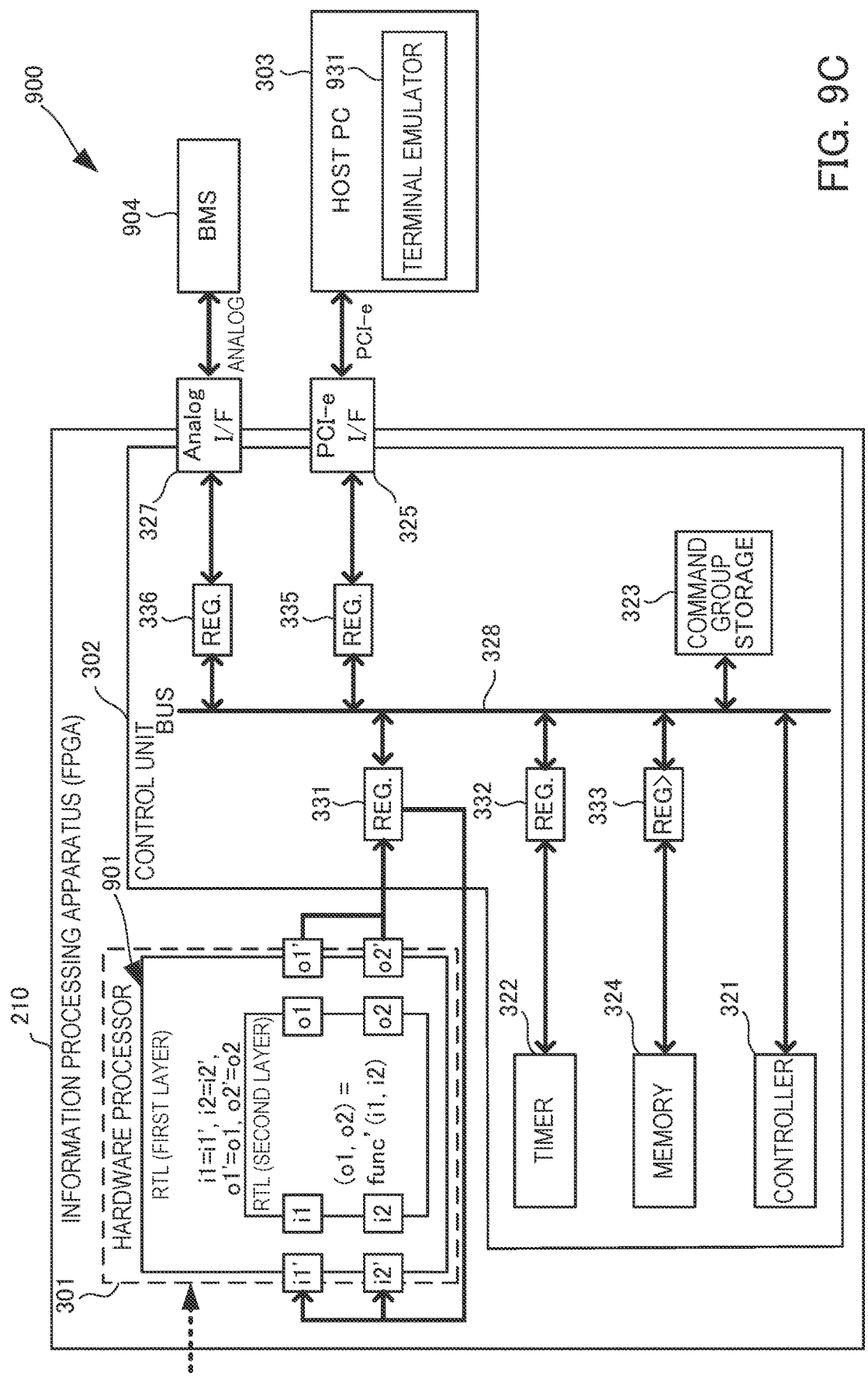
FIG. 9C is a view showing the configuration of the information processing system in the second use example of the information processing apparatus according to the second example embodiment of the present invention.

FIG. 9C is a view showing the configuration of the information processing system 900 in the second use example of the information processing apparatus 210. Note that in FIG. 9C, the same reference numerals as in FIGS. 3 and 8C denote the similar components and a repetitive description thereof will be omitted.

The hardware design data of the RTL (custom) 901 of the battery model is written in the hardware processor 301. Referring to FIG. 9C, the register 335 is set so that the I/O IF 325 connected to the user terminal 303 operates as a PCI-e I/F. Furthermore, the BMS 904 is connected to the Analog IF 327. Then, the user terminal 303 operates a terminal emulator 931 instead of the GUI. The terminal emulator 931 inputs a command to perform transmission to the information processing apparatus 210. The input command includes a command for setting parameter information of software in the register 331 and a command for setting a method of converting an analog signal and a digital signal in the register 336. The input command also includes a command for setting an event generation timing or period in the register 332, a command for setting, in the command group storage 323, a command group to be executed by the controller, and a command for executing/stopping software implemented by hardware.

Third Use Example

Figure 10:
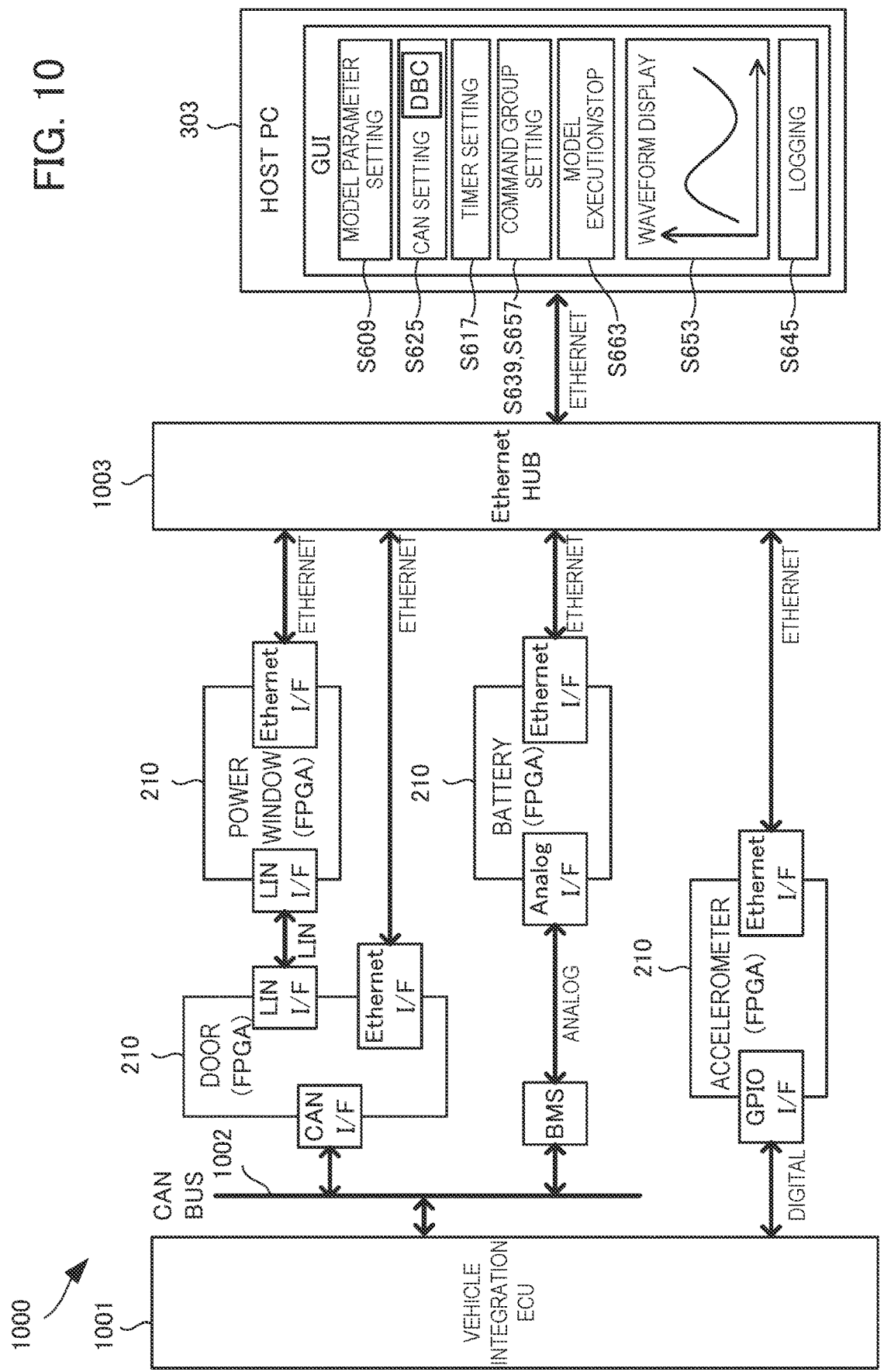
FIG. 10 is a view showing the configuration of an information processing system in the third use example of the information processing apparatus according to the second example embodiment of the present invention.

FIG. 10 is a view showing the configuration of an information processing system 1000 in the third use example of the information processing apparatus 210. Note that in FIG. 10, the same reference numerals as in FIGS. 3, 8C, and 9C denote the similar components and a repetitive description thereof will be omitted.

In the information processing system 1000, the information processing apparatuses 210 emulate a plurality of apparatus models to test the operation of a vehicle integration ECU 1001. The information processing apparatuses 210 emulate a door, a power window, a battery, and an accelerometer. That is, the information processing apparatuses 210 perform an operation based on software emulating a door of a vehicle, an operation based on software emulating a power window, an operation based on software emulating a rechargeable battery, and an operation based on software emulating an accelerometer. The user terminal 303 communicates with the respective information processing apparatuses 210 by an Ethernet® HUB 1003. Connection to the vehicle integration ECU 1001 by a CAN bus 1002 indicates an example of CAN connection, and the accelerometer is an example of GPIO connection. Note that in fact, a number of other apparatuses are connected to the vehicle integration ECU but FIG. 10 would be complicated and thus the minimum number of components that cover the signal types are shown.

Fourth Use Example

Figure 11A:
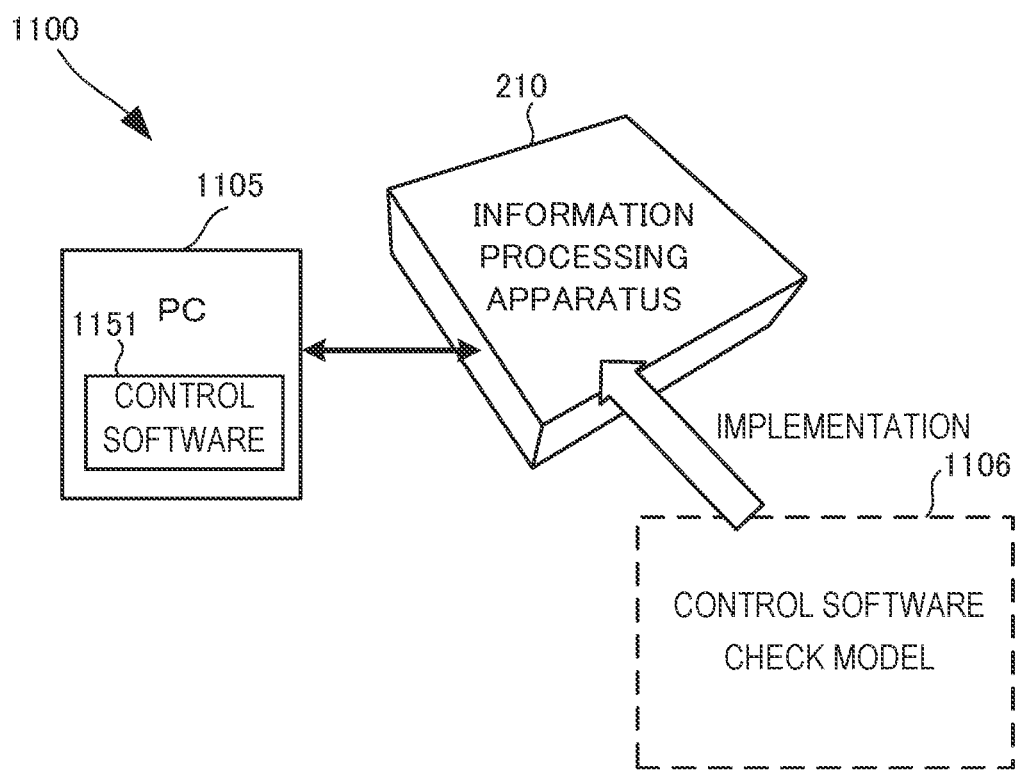
FIG. 11A is a view showing the configuration of an information processing system in the fourth use example of the information processing apparatus according to the second example embodiment of the present invention.

FIG. 11A is a view showing an information processing system 1100 in the fourth use example of the information processing apparatus 210.

The information processing apparatus 210 shown in FIG. 11A simulates a control software check model 1106, and outputs corresponding data. Then, control software 1151 mounted on a PC 1105 is test target software.

Figure 11B:
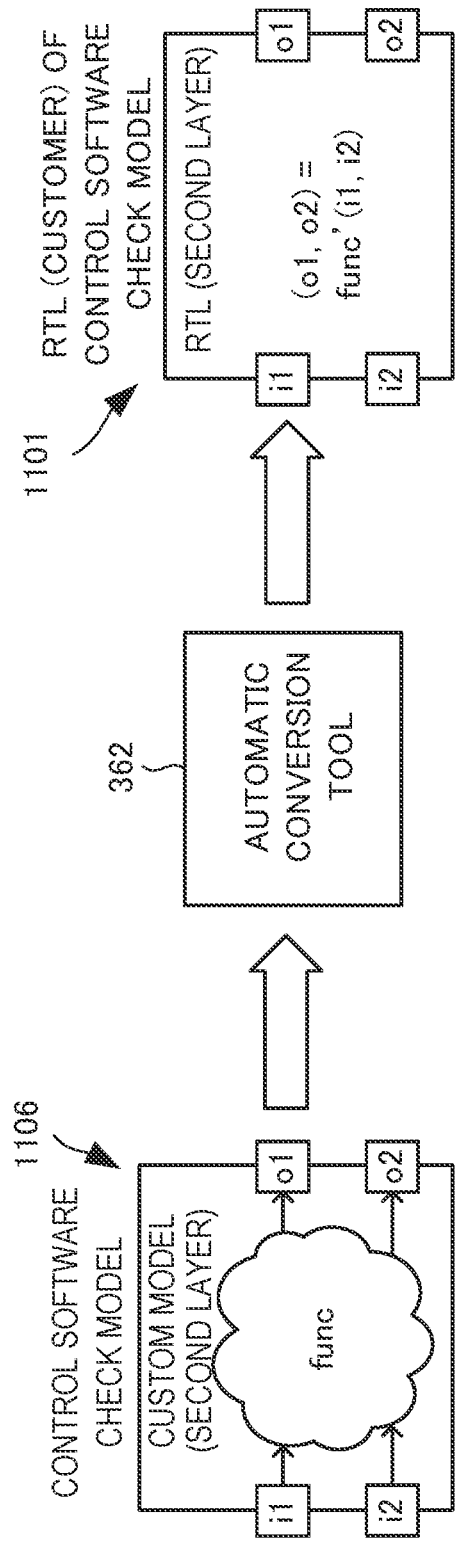
FIG. 11B is a view showing generation of hardware design data in the fourth use example of the information processing apparatus according to the second example embodiment of the present invention.

FIG. 11B is a view showing generation of hardware design data 1101 in the fourth use example of the information processing apparatus 210.

The control software check model 1106 is converted into the RTL (custom) 1101 of the control software check model by the automatic conversion tool 362.

Figure 11C:
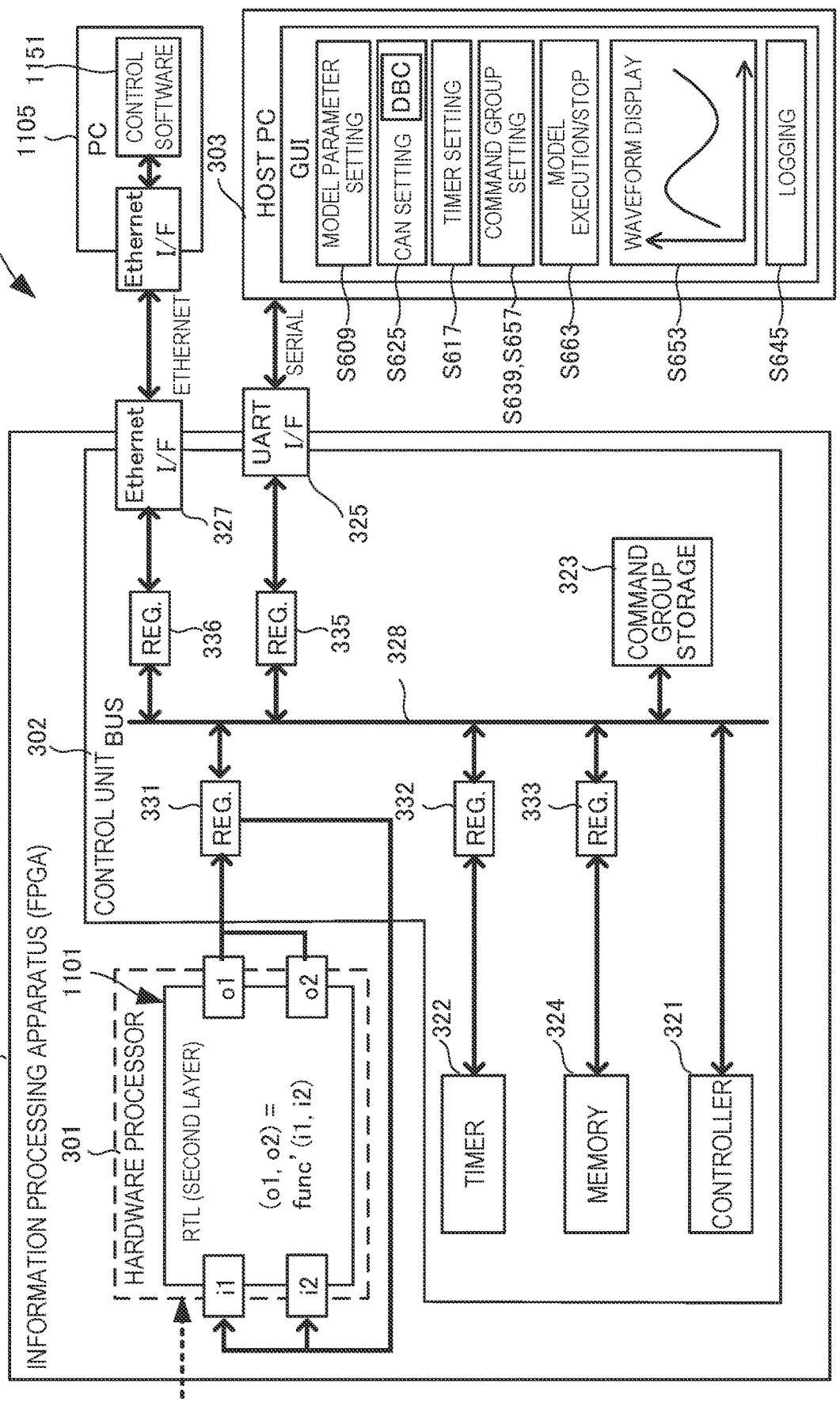
FIG. 11C is a view showing the configuration of the information processing system in the fourth use example of the information processing apparatus according to the second example embodiment of the present invention.

FIG. 11C is a view showing the configuration of the information processing system 1100 in the fourth use example of the information processing apparatus 210. Note that in FIG. 11C, the same reference numerals as in FIGS. 3, 8C, and 9C denote the similar components and a repetitive description thereof will be omitted.

The hardware design data of the RTL (custom) 1101 of the control software check model is written in the hardware processor 301. Referring to FIG. 11C, the register 336 is set so that the I/O IF 327 connected to the PC 1105 operates as an Ethernet® I/F.

Note that in the fourth use example, if the control software is BMS software, the same description as in the second use example applies.

According to this example embodiment, by rewriting the hardware design data of the RTL (custom) to be written in the hardware processor, it is possible to emulate a different model. Furthermore, the user can readily adjust, from the user terminal, the input/output and the timing in emulating the model. The user can also readily set, from the user terminal, an interface to be connected to an apparatus in accordance with the apparatus. Moreover, the user can readily set, from the user terminal, signal monitoring or logging, or creation of a graph of a signal or a table.

Third Example Embodiment

An information processing apparatus according to the third example embodiment of the present invention will be described next. The information processing apparatus according to this example embodiment is different from that according to the above-described second example embodiment that the information processing apparatus includes no memory that buffers output data from a hardware processor. The remaining components and operations are similar to those in the second example embodiment. Hence, the same reference numerals denote similar components and operations, and a detailed description thereof will be omitted.
(Functional Arrangement of Information Processing Apparatus)

Figure 12:
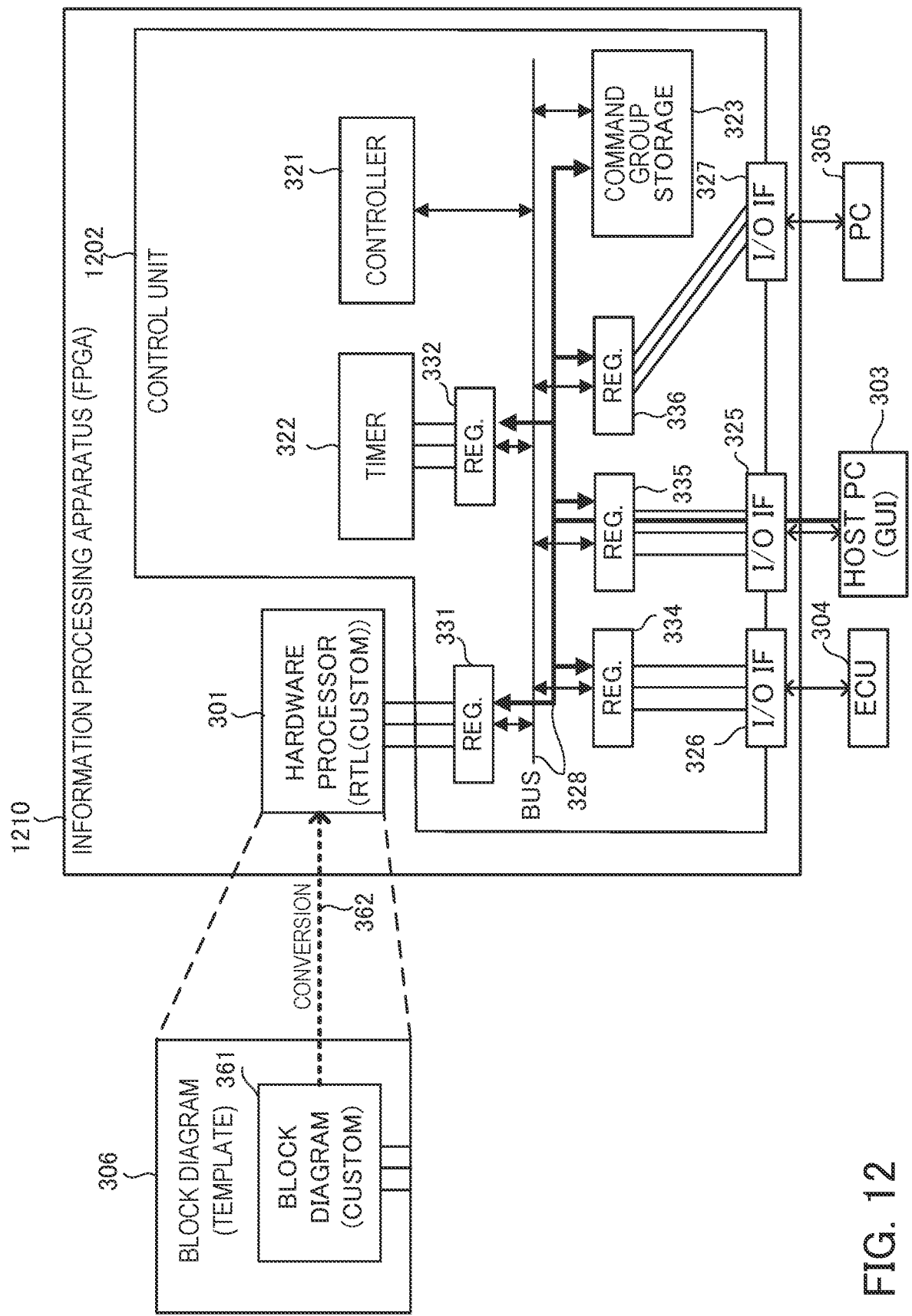
FIG. 12 is a block diagram showing the functional arrangement of an information processing apparatus according to the third example embodiment of the present invention.

FIG. 12 is a block diagram showing the functional arrangement of an information processing apparatus 1210. Note that in FIG. 12, the same reference numerals as in FIG. 3 denote the similar components and a repetitive description thereof will be omitted.

In the information processing apparatus 1210, the memory 324 shown in FIG. 3 is eliminated. As long as the data amount of the input/output of a hardware processor 301 is not large or as long as a communication capacity is sufficient and it is unnecessary to buffer data, it is sufficiently possible to emulate a model with the arrangement of this example embodiment.

According to this example embodiment, it is possible to provide a compact and inexpensive information processing apparatus by eliminating an extra memory.

Fourth Example Embodiment

An information processing apparatus according to the fourth example embodiment of the present invention will be described next. The information processing apparatus according to this example embodiment is different from those according to the above-described second and third example embodiments that the information processing apparatus has an arrangement dedicated for HILS. The remaining components and operations are similar to those in the second and third example embodiments. Hence, the same reference numerals denote similar components and operations, and a detailed description thereof will be omitted.
(Functional Arrangement of Information Processing Apparatus)

Figure 13:
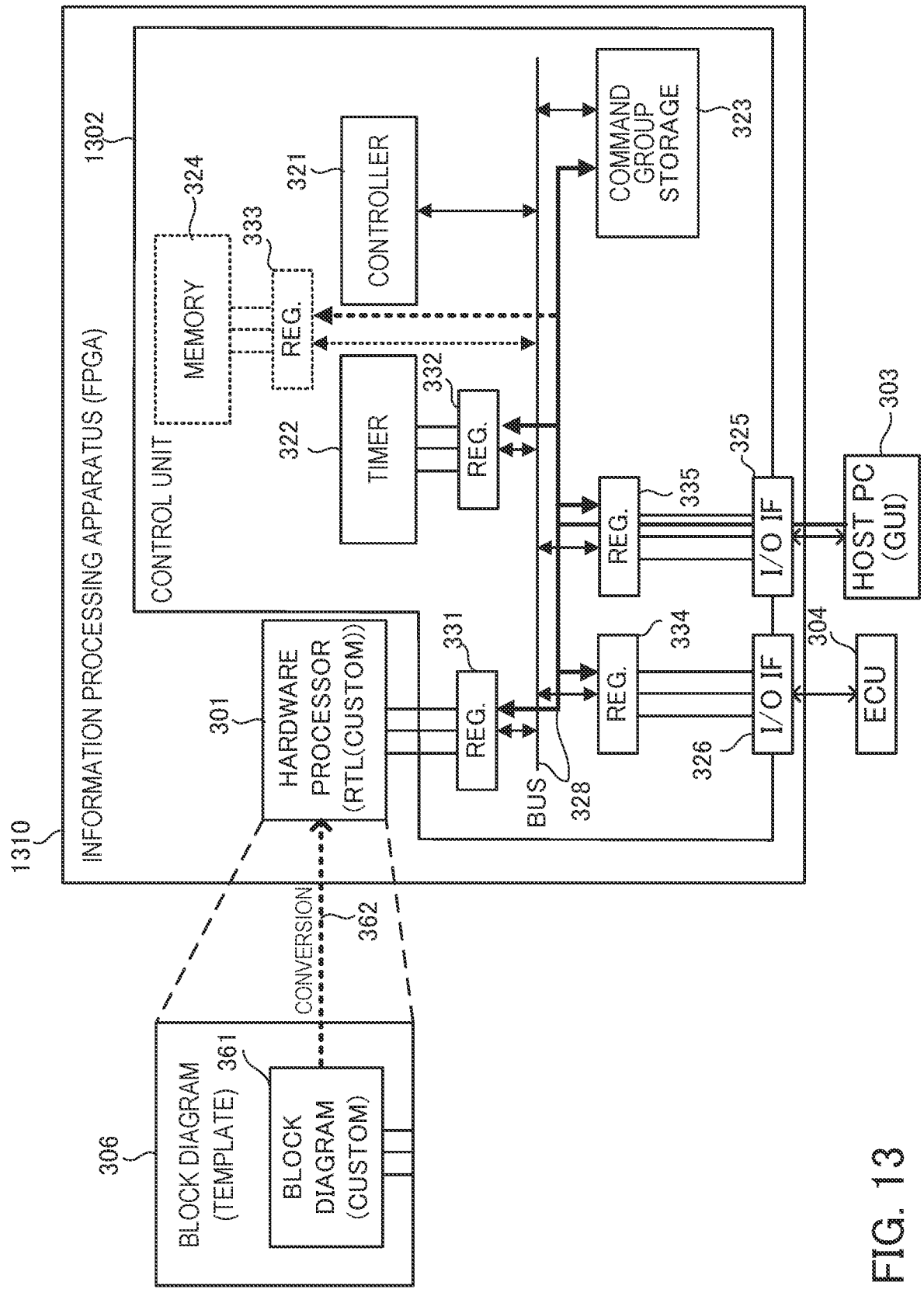
FIG. 13 is a block diagram showing the functional arrangement of an information processing apparatus according to the fourth example embodiment of the present invention.

FIG. 13 is a block diagram showing the functional arrangement of an information processing apparatus 1310. In FIG. 13, the same reference numerals as in FIGS. 3 and 12 denote the similar components and a repetitive description thereof will be omitted.

In the information processing apparatus 1310, the I/O IF 327 shown in FIG. 3 for testing control software is eliminated. That is, the information processing apparatus 1310 has an arrangement dedicated for HILS.

According to this example embodiment, it is possible to provide a compact and inexpensive information processing apparatus by eliminating an extra component when used exclusively for HILS.

Fifth Example Embodiment

An information processing apparatus according to the fifth example embodiment of the present invention will be described next. The information processing apparatus according to this example embodiment is different from those according to the above-described second to fourth example embodiments that the information processing apparatus has an arrangement dedicated for MILS. The remaining components and operations are similar to those in the second to fourth example embodiments. Hence, the same reference numerals denote similar components and operations, and a detailed description thereof will be omitted.
(Functional Arrangement of Information Processing Apparatus)

Figure 14:
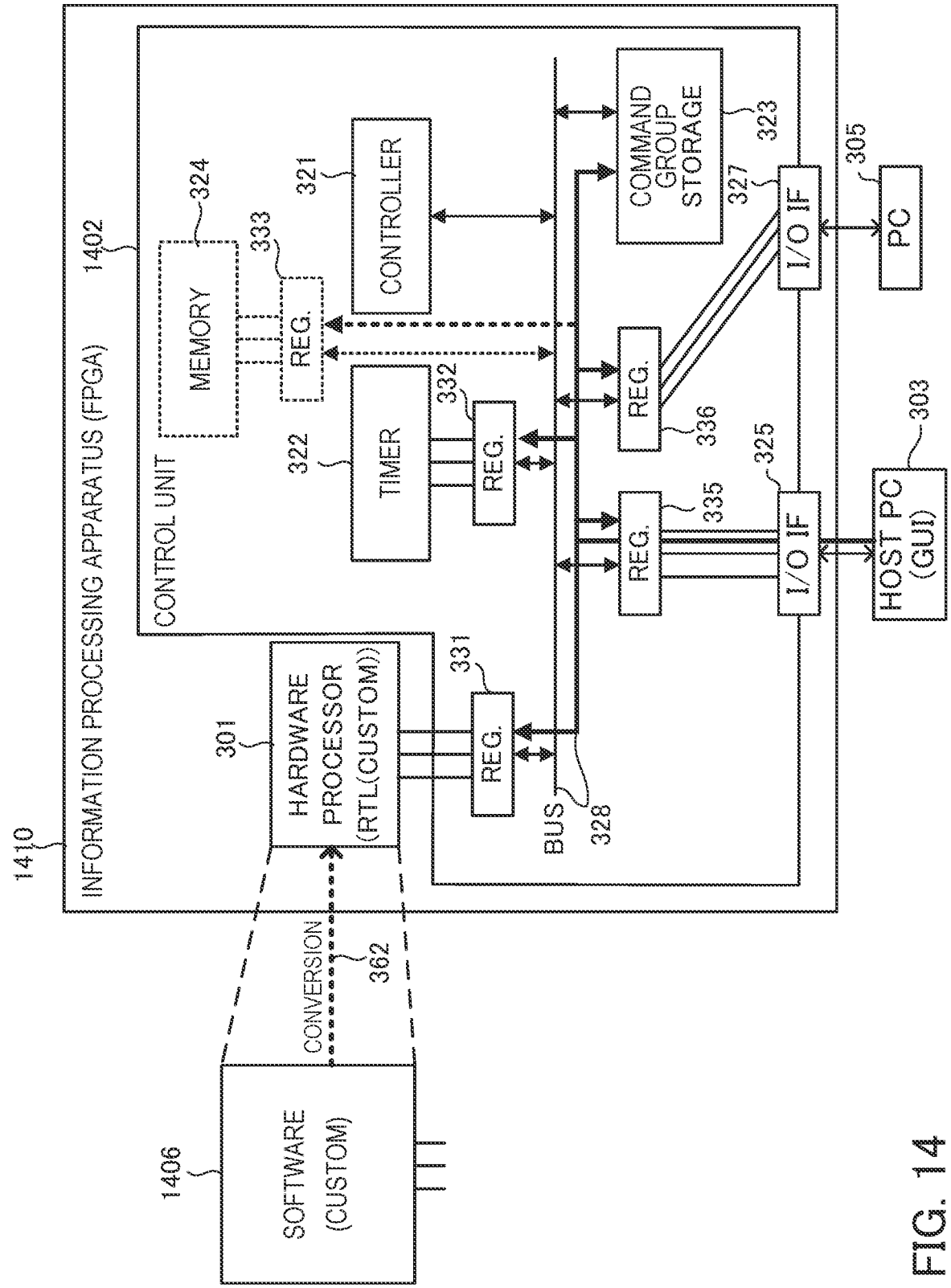
FIG. 14 is a block diagram showing the functional arrangement of an information processing apparatus according to the fifth example embodiment of the present invention.

FIG. 14 is a block diagram showing the functional arrangement of an information processing apparatus 1410. In FIG. 14, the same reference numerals as in FIGS. 3, 12, and 13 denote the similar components and a repetitive description thereof will be omitted.

In the information processing apparatus 1410, the I/O IF 326 shown in FIG. 3 for testing an apparatus such as an ECU is eliminated. That is, the information processing apparatus 1410 has an arrangement dedicated for MILS.

According to this example embodiment, it is possible to provide a compact and inexpensive information processing apparatus by eliminating an extra component when used exclusively for MILS.

Sixth Example Embodiment

An information processing apparatus according to the sixth example embodiment of the present invention will be described next. The information processing apparatus according to this example embodiment is different from those according to the above-described second to fifth example embodiments that a mixed signal model is emulated without changing the arrangement of the information processing apparatus. The remaining components and operations are similar to those in the second to fifth example embodiments. Hence, the same reference numerals denote similar components and operations, and a detailed description thereof will be omitted.

(Functional Arrangement of Information Processing Apparatus)

Figure 15:
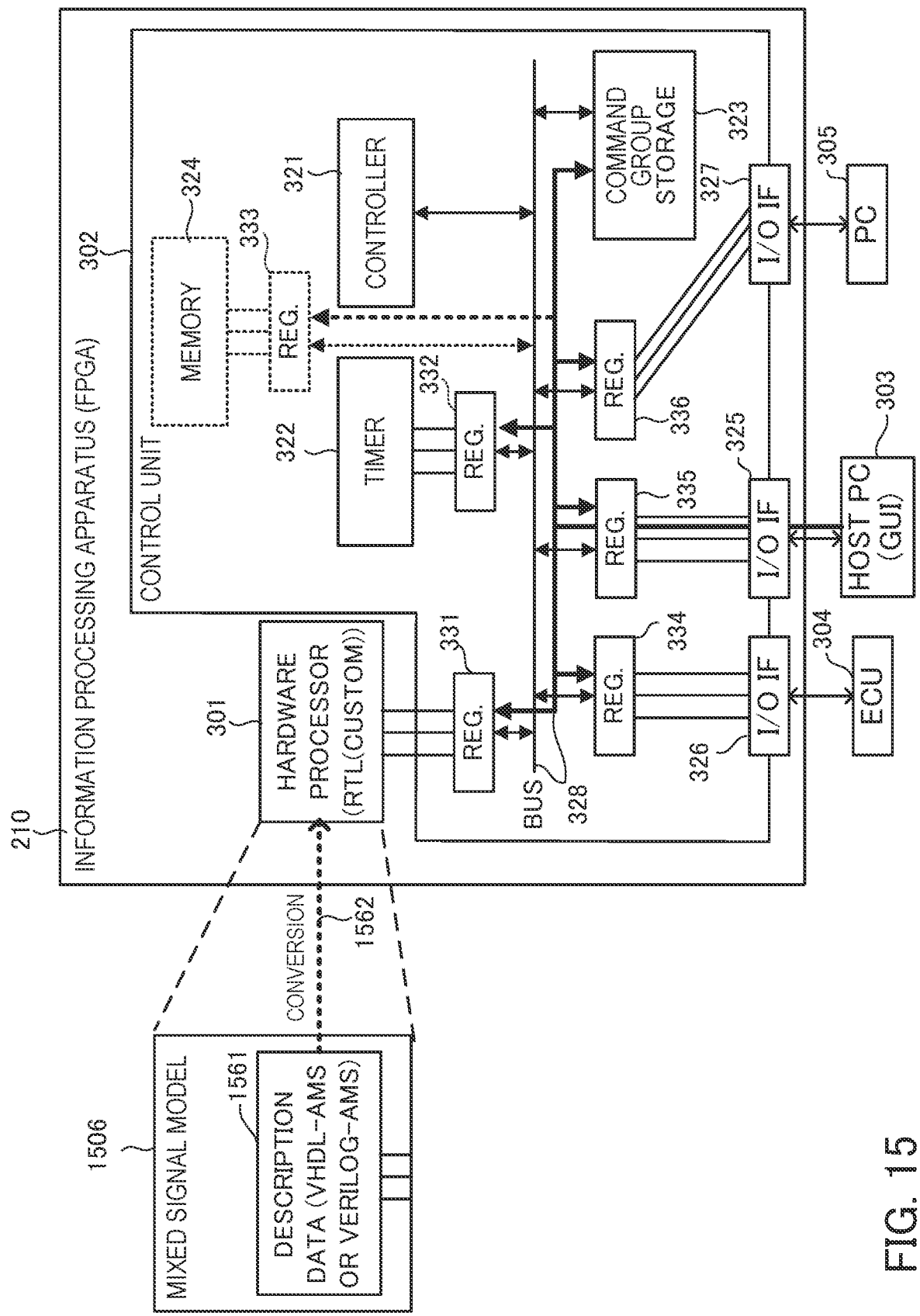
FIG. 15 is a block diagram showing the functional arrangement of an information processing apparatus according to the sixth example embodiment of the present invention.

FIG. 15 is a block diagram showing an example in which an information processing apparatus 210 is used to emulate a mixed signal model 1506. In FIG. 15, the same reference numerals as in FIGS. 3, 12, 13, and 14 denote the similar components and a repetitive description thereof will be omitted. An apparatus model or software model represented by the mixed signal model 1506 is a model that uses both a digital signal and an analog signal.

Referring to FIG. 15, hardware design data of the RTL (custom) to be written in a hardware processor 301 is generated by converting description data 1561 of the mixed signal model 1506 in VHDL-AMS or Verilog-AMS.

According to this example embodiment, it is possible to readily emulate a mixed signal model and a model by a block diagram without changing the arrangement of the information processing apparatus.

Seventh Example Embodiment

An information processing apparatus according to the seventh example embodiment of the present invention will be described next. The information processing apparatus according to this example embodiment is different from those according to the above-described second to sixth example embodiments that the information processing apparatus is implemented not by an FPGA but by an ASIC (Application Specific Integrated Circuit). The remaining components and operations are similar to those in the second to sixth example embodiments. Hence, the same reference numerals denote similar components and operations, and a detailed description thereof will be omitted.

(Functional Arrangement of Information Processing Apparatus)

Figure 16:
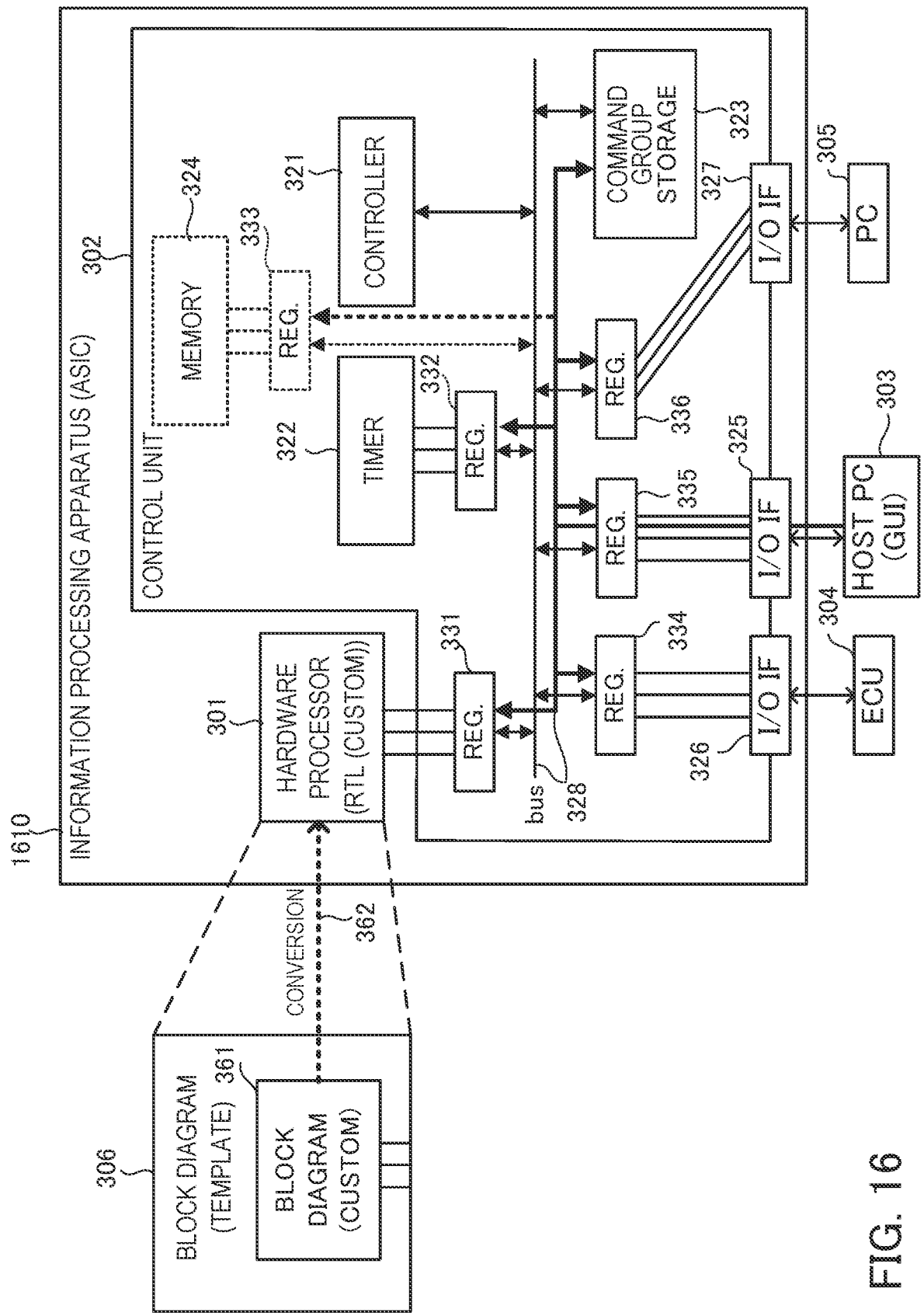
FIG. 16 is a block diagram showing the functional arrangement of an information processing apparatus according to the seventh example embodiment of the present invention.

FIG. 16 is a block diagram showing the functional arrangement of an information processing apparatus 1610. In FIG. 16, the same reference numerals as in FIGS. 3, 12, 13, 14, and 15 denote the similar components and a repetitive description thereof will be omitted.

The information processing apparatus 1610 is implemented not by an FPGA but by an ASIC (Application Specific Integrated Circuit). Note that FIG. 16 shows an arrangement corresponding to FIG. 3 but is also applicable to the above-described third to sixth example embodiments.

According to this example embodiment, it is possible to emulate a model with a small delay at a low cost.

Eighth Example Embodiment

An information processing apparatus according to the eighth example embodiment of the present invention will be described next. The information processing apparatus according to this example embodiment is different from those according to the above-described second to seventh example embodiments that the information processing apparatus capable of emulating a mixed signal model intact is provided. The remaining components and operations are similar to those in the second example embodiment. Hence, the same reference numerals denote similar components and operations, and a detailed description thereof will be omitted.

(Information Processing System Including Information Processing Apparatus)

Figure 17:
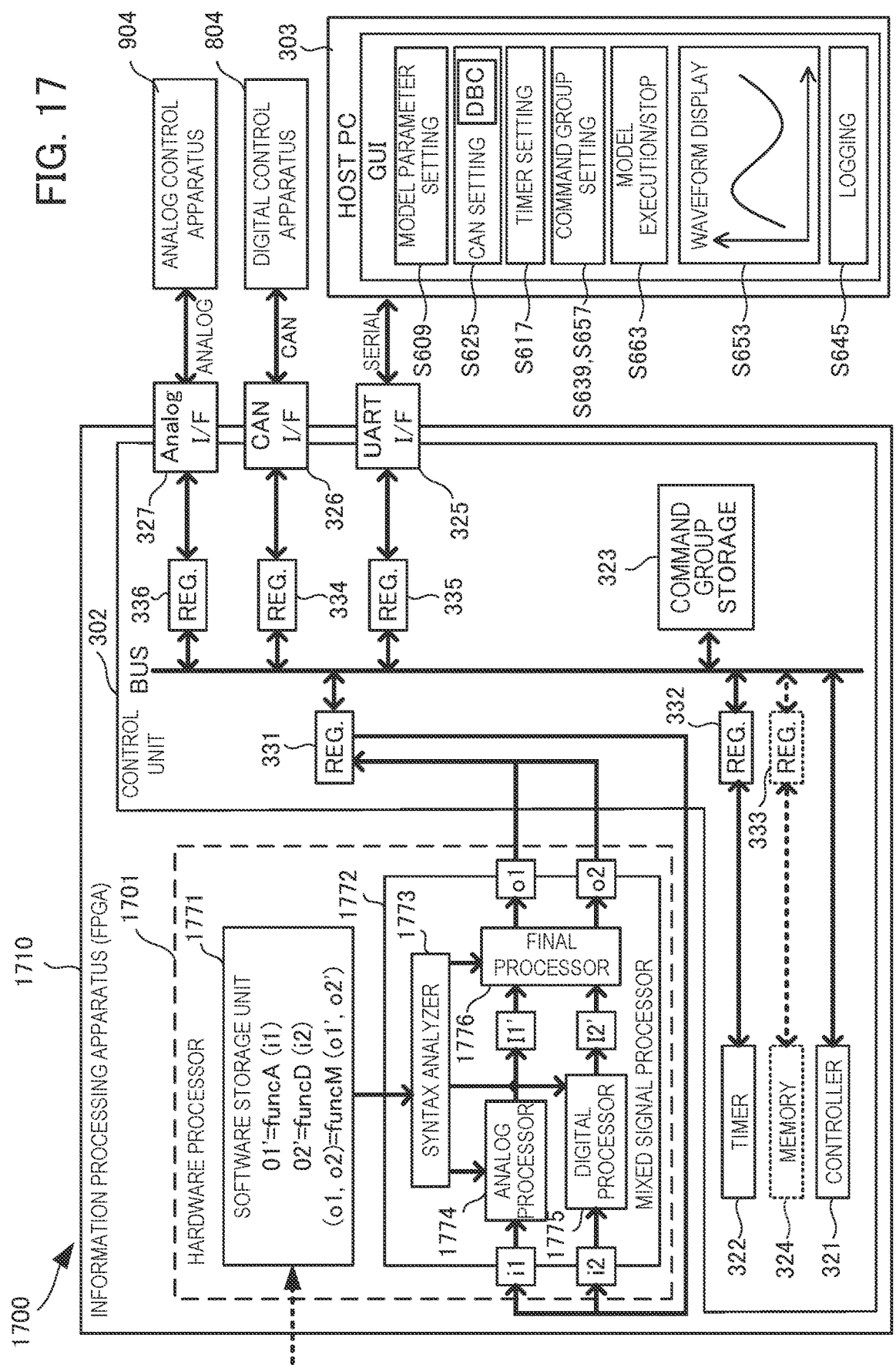
FIG. 17 is a block diagram showing the functional arrangement of an information processing system including an information processing apparatus according to the eighth example embodiment of the present invention.

FIG. 17 is a block diagram showing the functional arrangement of an information processing system 1700 including an information processing apparatus 1710. In FIG. 17, the same reference numerals as in FIGS. 3, 12, 13, 14, 15, and 16 denote the similar components and a repetitive description thereof will be omitted.

In the information processing apparatus 1710, a hardware processor 1701 has an arrangement capable of writing, intact, a mixed signal model that uses both a digital signal and an analog signal. The hardware processor 1701 includes a software storage 1771 and a mixed signal processor 1772.

In the software storage 1771, software of the mixed signal model described in VHDL-AMS or Verilog-AMS is written. The mixed signal processor 1772 includes a syntax analyzer 1773, an analog processor 1774, a digital processor 1775, and a final processor 1776. The software stored in the software storage 1771 undergoes syntax analysis by the syntax analyzer 1773, and is separated into an analog portion and a digital portion. Then, the analog portion is processed by the analog processor 1774, and the digital portion is processed by the digital processor 1775. Finally, the processing result of the analog processor 1774 and that of the digital processor 1775 are preferably merged by the final processor 1776, thereby outputting the emulation result of the mixed signal model.

Note that the mixed signal processor 1772 may be formed by hardware, software, or a combination thereof.

According to this example embodiment, as compared with the sixth example embodiment, it is possible to perform emulation more accurately than conversion into the RTL (custom) since the mixed signal model can be emulated intact.

Ninth Example Embodiment

An information processing apparatus according to the ninth example embodiment of the present invention will be described next. The information processing apparatus according to this example embodiment is different that a different method of setting hardware design data for making the information processing apparatus according to each of the above-described second to eighth example embodiments operable is indicated. The remaining components and operations are similar to those in the second to eighth example embodiments. Hence, the same reference numerals denote similar components and operations, and a detailed description thereof will be omitted.

(Setting Procedure of Hardware Design Data)

Figure 18:
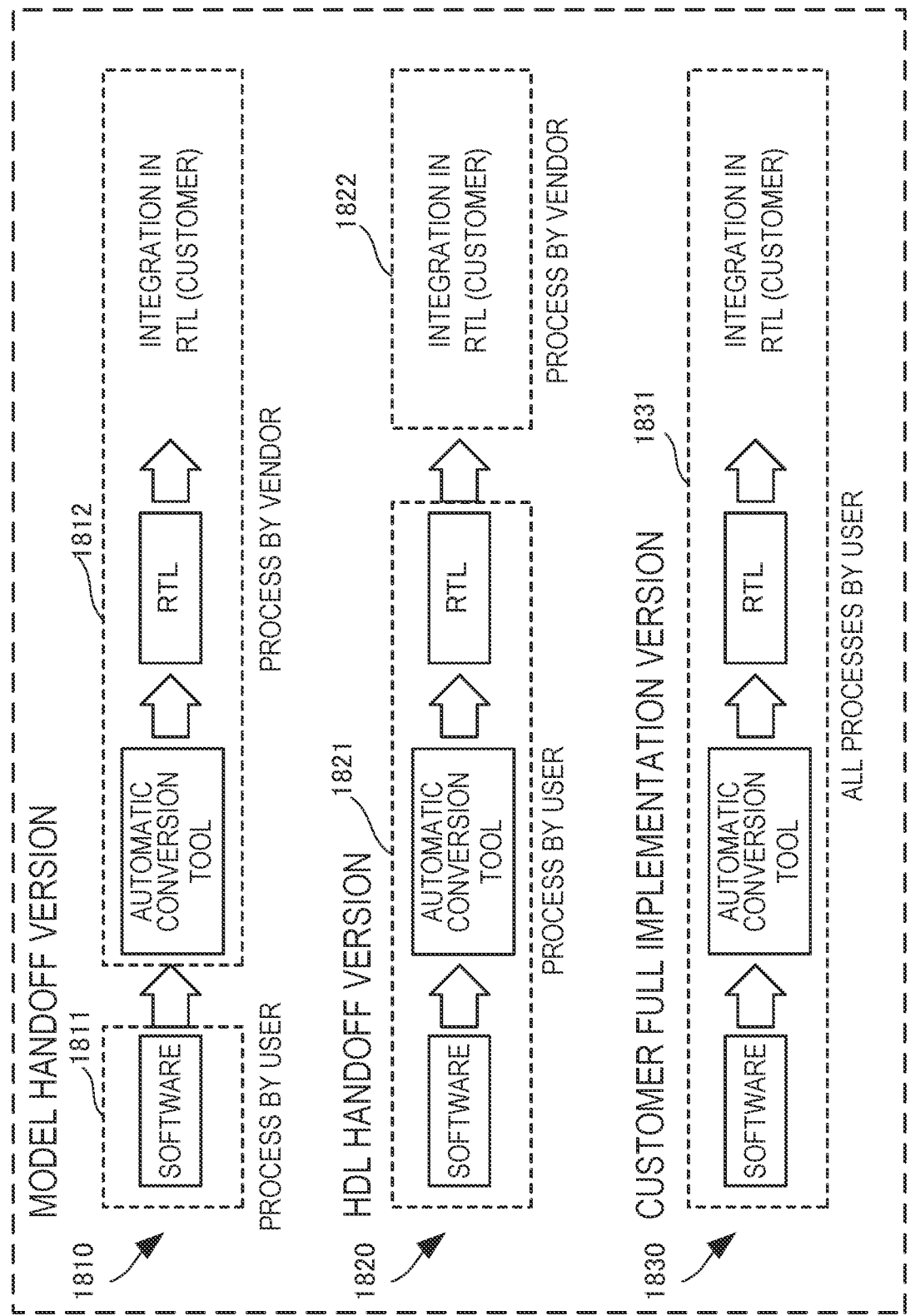
FIG. 18 is a view showing differences among methods of setting hardware design data in an information processing apparatus according to the ninth example embodiment of the present invention.

FIG. 18 is a view showing differences among methods of setting hardware design data in the information processing apparatus.

In a hardware design data setting method 1810, the user generates software 1811 of a model, and passes it to a vendor. The vendor converts the software into the RTL by an automatic conversion tool, performs integration 1812 in the RTL (custom), and provides the resultant data to the user. In FIG. 18, this is referred to as "model handoff version".

In a hardware design data setting method 1820, the user generates software of a model, performs conversion 1821 of the software into the RTL by the automatic conversion tool, and passes the resultant data to the vendor. Then, the vendor performs integration 1822 in the RTL (custom), and provides the resultant data to the user. In FIG. 18, this is referred to as "HDL handoff version".

In a hardware design data setting method 1830, the user performs all of a step of generating software of a model, a step of converting the software into the RTL by the automatic conversion tool, and a step of performing integration into the RTL (custom). In FIG. 18, this is referred to as "customer full implementation version".

Note that for the information processing apparatus 1710 of the eighth example embodiment (FIG. 17), the user processes all the steps, as in the hardware design data setting method 1830.

According to this example embodiment, the user and the vendor can share the processes appropriately.

10th Example Embodiment

An information processing system that emulates an apparatus model or software model according to the 10th example embodiment of the present invention will be described next. The information processing system according to this example embodiment is different that an emulation operation by the information processing apparatus according to each of the above-described second to ninth example embodiments is executed by a cloud server. The operation is the same as in each of the second to ninth example embodiments. Thus, the reference numerals denote the similar components and operations and a detailed description thereof will be omitted.

<<Information Processing System>>

Figure 19:
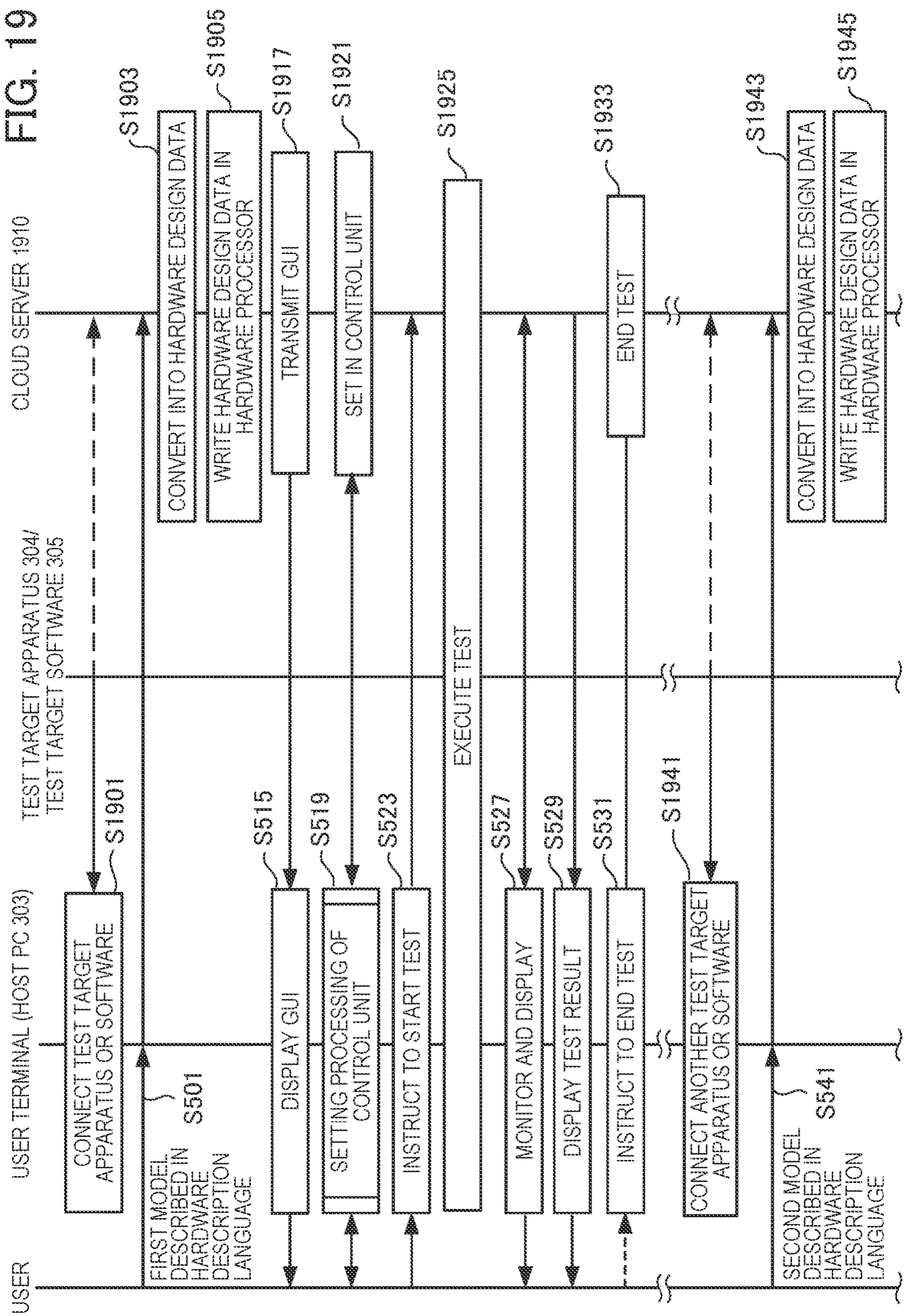
FIG. 19 is a sequence chart showing the processing procedure of an information processing system according to the 10th example embodiment of the present invention.

FIG. 19 is a sequence chart showing the processing procedure of an information processing system 1900. Note that in FIG. 19, the same step numbers as in FIG. 5 denote the same steps and a repetitive description thereof will be omitted.

In step S1901, a test target apparatus 304 or an apparatus on which test target software 305 is mounted is connected to a user terminal 303.

Upon receiving, from the user terminal 303, data of the first model described in a hardware description language from the user, a cloud server 1910 converts, in step S1903, the data into hardware design data. Then, in step S1905, the cloud server 1910 writes the data in a region on the cloud server 1910 equivalent to a hardware processor. In step S1917, the cloud server 1910 transmits a GUI to the user terminal 303. Then, with reference to the GUI, data set from the user terminal 303 are written in regions on the cloud server 1910 equivalent to a command group register and registers of a control unit. Upon receiving a test start instruction from the user terminal 303, the cloud server 1910 executes a test in step S1925. Upon receiving a test end instruction from the user terminal 303, the cloud server 1910 ends the test in step S1933.

Note that it is shown that in execution of the test in step S1925, a test target apparatus or test target software is tested from the cloud server 1910 via the user terminal 303. However, the user terminal 303 only relays communication with a virtual information processing apparatus created in the cloud server 1910. Alternatively, the test target apparatus or test target software may be connected to the cloud server 1910 in addition to the user terminal 303.

Subsequent steps S1941 to S1945 indicate emulation by the cloud server 1910 based on data of the second model, described in a hardware description language, different from the first model.

According to this example embodiment, it is possible to readily emulate various models without using a time and expense required to create hardware.

Other Example Embodiments

Note that each of the above-described example embodiments has explained a case in which two I/O IFs or one dedicated I/O IF is connected to a test target apparatus. However, the number of I/O IFs can be increased to verify a plurality ECUs or model software components in a plurality of PCs at the same time.

While the invention has been particularly shown and described with reference to example embodiments thereof, the invention is not limited to these example embodiments. It will be understood by those of ordinary skill in the art that various changes in form and details may be made therein without departing from the spirit and scope of the present invention as defined by the claims. For example, the number of I/O IFs can be increased to verify a plurality of ECUs or control models in a plurality of PCs at the same time. A system or apparatus including any combination of the individual features included in the respective example embodiments may be incorporated in the scope of the present invention.

The present invention is applicable to a system including a plurality of devices or a single apparatus. The present invention is also applicable even when an information processing program for implementing the functions of example embodiments is supplied to the system or apparatus directly or from a remote site. Hence, the present invention also incorporates the program installed in a computer to implement the functions of the present invention by the computer, a medium storing the program, and a WWW (World Wide Web) server that causes a user to download the program. Especially, the present invention incorporates at least a non-transitory computer readable medium storing a program that causes a computer to execute processing steps included in the above-described example embodiments.

The invention claimed is:

1. An information processing apparatus comprising:
an emulator that emulates, by a hardware, operations corresponding to a model by performing hardware design data described in a hardware description language; and
a control unit that controls, in accordance with instructions of a user received from a user terminal, inputs to said emulator and outputs from said emulator,
wherein said control unit includes:
a controller that cannot be accessed by the user and that executes a command group;
a timer for controlling a timing of executing the command group;
a memory for buffering data output from the emulator;
registers rewritable by the user that include registers for controlling the inputs and outputs of said emulator and registers for controlling operations of said controller, said timer, and said memory;

a command group storage that is rewritable by the user and stores command groups to be executed by said controller; and an interface unit that connects the information processing apparatus to external apparatuses.

2. The information processing apparatus according to claim 1, wherein said interface unit includes a first interface that connects said control unit to the user terminal as one of the external apparatuses, and a second interface that connects at least one of the inputs to said emulator and the outputs from said emulator to a test target apparatus as one of the external apparatuses.

3. The information processing apparatus according to claim 1, wherein said interface unit includes a first interface that connects said control unit to the user terminal as one of the external apparatuses, and a third interface that connects at least one of the inputs to said emulator and the outputs from said emulator to an apparatus, on which test target software is mounted, as one of the external apparatuses.

4. The information processing apparatus according to claim 1, wherein the registers are memory mapped I/Os, and each of the registers controls at least one of the inputs and outputs of said emulator, at least one of inputs and outputs of said controller, or at least one of inputs and outputs of said interface unit.

5. The information processing apparatus according to claim 1, wherein the hardware description language is a first hardware description language in which one of a hardware model and a software model using digital signals is described, and said emulator can perform the operations corresponding to the model described in the first hardware description language when hardware design data generated based on one of the hardware model and the software model described in the first hardware description language is stored in said emulator.

6. The information processing apparatus according to claim 1, wherein the hardware description language is a second hardware description language in which one of a hardware model and a software model using analog signals is described, and said emulator can perform the operations corresponding to the model described in the second hardware description language when hardware design data generated based on one of the hardware model and the software model described in the second hardware description language is stored in said emulator.

7. The information processing apparatus according to claim 1, wherein the hardware description language is a second hardware description language in which a mixed signal model using analog signals and digital signals is described, and said emulator can perform the operations corresponding to the model described in the second hardware description language when hardware design data generated based on the mixed signal model described in the second hardware description language is stored in said emulator.

8. The information processing apparatus according to claim 1, wherein the hardware description language is a third hardware description language in which a mixed signal model using analog signals and digital signals is described, said emulator includes a software storage and a mixed signal processor, and wherein in said emulator, when software of the mixed signal model described in the third hardware description language is stored in said software storage, the operations corresponding to the model described in the third hardware description language can be performed by said mixed signal processor that analyzes the software to input and output the analog signals and the digital signals.

9. The information processing apparatus according to claim 1, wherein the information processing apparatus is one of an FPGA (Field-Programmable Gate Array) and an ASIC (Application Specific Integrated Circuit).

10. A use method of an information processing apparatus according to claim 1, the method comprising:

setting an emulator in the information processing apparatus to emulate, by hardware, operations corresponding to a model described in a hardware description language;

connecting, to the information processing apparatus, an apparatus on which one of a test target apparatus and a test target software is mounted and a user terminal that accepts instructions of a user for controlling the information processing apparatus and transmits the instructions to the information processing apparatus;

transmitting and setting data to the information processing apparatus based on the instructions of the user accepted by the user terminal with reference to a first screen for accepting the instructions of the user for controlling the information processing apparatus; and displaying, on the user terminal, a second screen for displaying at least one of inputs to the information processing apparatus and outputs from the information processing apparatus based on the set data and a processing result by the emulator in the information processing apparatus using the set data.

11. The use method of the information processing apparatus according to claim 10, further comprising converting operations of a model to be emulated by software into the model described in the hardware description language.

12. An information processing system comprising:

an information processing apparatus that emulates one of a software model and an apparatus model by performing hardware design data described in a hardware description language;

an apparatus that is connected to said information processing apparatus and on which one of a test target apparatus and a test target software is mounted; and a user terminal that accepts instructions of a user for controlling said information processing apparatus and transmits the instructions to said information processing apparatus, said information processing apparatus comprising an emulator that emulates, by hardware, operations corresponding to one of the software model and the apparatus model, and a control unit that controls, in accordance with the instructions of the user received from said user terminal, inputs to said emulator and outputs from said emulator, wherein said control unit includes a controller that cannot be accessed by the user and that executes a command group;

a timer for controlling a timing of executing the command group;
a memory for buffering data output from the emulator;
registers rewritable by the user that include registers for controlling the inputs and outputs of said emulator and registers for controlling operations of said controller, said timer, and said memory;
a command group storage that is rewritable by the user and stores command groups to be executed by said controller, and
an interface unit that connects said information processing apparatus to external apparatuses.

13. The information processing system according to claim 12, wherein the registers are memory mapped I/Os, and each of the registers controls at least one of the inputs and outputs of said emulator, at least one of inputs and outputs of said controller, or at least one of inputs and outputs of said interface unit.

14. The information processing system according to claim 12, wherein
the hardware description language is a first hardware description language in which one of a hardware model and a software model using digital signals is described, and
said emulator can perform the operations corresponding to the model described in the first hardware description language when hardware design data generated based on one of the hardware model and the software model described in the first hardware description language is stored in said emulator.

15. The information processing system according to claim 12, wherein
the hardware description language is a second hardware description language in which one of a hardware model and a software model using analog signals is described, and
said emulator can perform the operations corresponding to the model described in the second hardware description language when hardware design data generated based on one of the hardware model and the software model described in the second hardware description language is stored in said emulator.

16. The information processing system according to claim 12, wherein
the hardware description language is a second hardware description language in which a mixed signal model using analog signals and digital signals is described, and
said emulator can perform the operations corresponding to the model described in the second hardware description language when hardware design data generated based on the mixed signal model described in the second hardware description language is stored in said emulator.

17. The information processing system according to claim 12, wherein
the hardware description language is a third hardware description language in which a mixed signal model using analog signals and digital signals is described,
said emulator includes a software storage and a mixed signal processor, and
wherein in said emulator, when software of the mixed signal model described in the third hardware description language is stored in said software storage, the operations corresponding to the model described in the third hardware description language can be performed by said mixed signal processor that analyzes the software to input and output the analog signals and the digital signals.

18. The information processing system according to claim 12, wherein the information processing apparatus is one of an FPGA (Field-Programmable Gate Array) and an ASIC (Application Specific Integrated Circuit).

* * * * *